(12) United States Patent
Makibuchi et al.

(10) Patent No.: US 7,518,470 B2
(45) Date of Patent: Apr. 14, 2009

(54) SURFACE ACOUSTIC WAVE ELEMENT, SURFACE ACOUSTIC WAVE DEVICE AND COMMUNICATION DEVICE INCLUDING THE SAME

(75) Inventors: Daisuke Makibuchi, Soraku-gun (JP);
Kazuhiro Otsuka, Soraku-gun (JP);
Kiyohiro Iioka, Soraku-gun (JP)

(73) Assignee: Kyocera Corporation, Kyoto (JP)

( * ) Notice: Subject to any disclaimer, the term of this patent is extended or adjusted under 35 U.S.C. 154(b) by 153 days.

(21) Appl. No.: 11/565,505

(22) Filed: Nov. 30, 2006

(65) Prior Publication Data
US 2007/0120626 A1 May 31, 2007

(30) Foreign Application Priority Data
Nov. 30, 2005 (JP) ............................. 2005-346962

(51) Int. Cl.
*H03H 9/00* (2006.01)
*H03H 9/205* (2006.01)
*H01L 41/02* (2006.01)

(52) U.S. Cl. ...................... 333/193; 333/133; 333/195

(58) Field of Classification Search ................. 333/133, 333/186, 193, 194, 195, 196
See application file for complete search history.

(56) References Cited
U.S. PATENT DOCUMENTS
5,568,002 A 10/1996 Kawakatsu et al. ..... 310/313 B 7,295,089 B2 * 11/2007 Shibahara et al. ........... 333/133
2001/0054942 A1 12/2001 Takamine et al. ........... 333/195
2003/0025576 A1 2/2003 Takamine .................... 333/193
2004/0080385 A1 4/2004 Takamine et al. ........... 333/133
2004/0201436 A1 10/2004 Takamine et al. ........... 333/195

FOREIGN PATENT DOCUMENTS

| JP | 11-097966 | 4/1999 |
| JP | 2002-84164 | 3/2002 |
| JP | 2003-46369 | 2/2003 |
| JP | 2004-96244 | 3/2004 |
| JP | 06-204781 | 7/2004 |

* cited by examiner

*Primary Examiner*—Dean O Takaoka
(74) *Attorney, Agent, or Firm*—Hogan & Hartson LLP

(57) ABSTRACT

A surface acoustic wave element 1 comprises a piezoelectric substrate 19, IDT electrodes 3, 4, 5 of an odd number not less than three formed along a propagation direction of surface acoustic waves that propagates on the piezoelectric substrate, wherein IDT electrodes 3, 5 of the odd number of IDT electrodes 3, 4, 5 disposed on both sides of an IDT electrode 4 that is located at the center are connected to first and second reference potential terminals 14, 15, respectively, and the first and second reference potential terminals 14 and 15 are formed asymmetrically with respect to a virtual central axis A that passes through the center of the IDT electrode 4 located at the center and provided in a direction perpendicular to the propagation direction.

17 Claims, 32 Drawing Sheets

FIG. 10
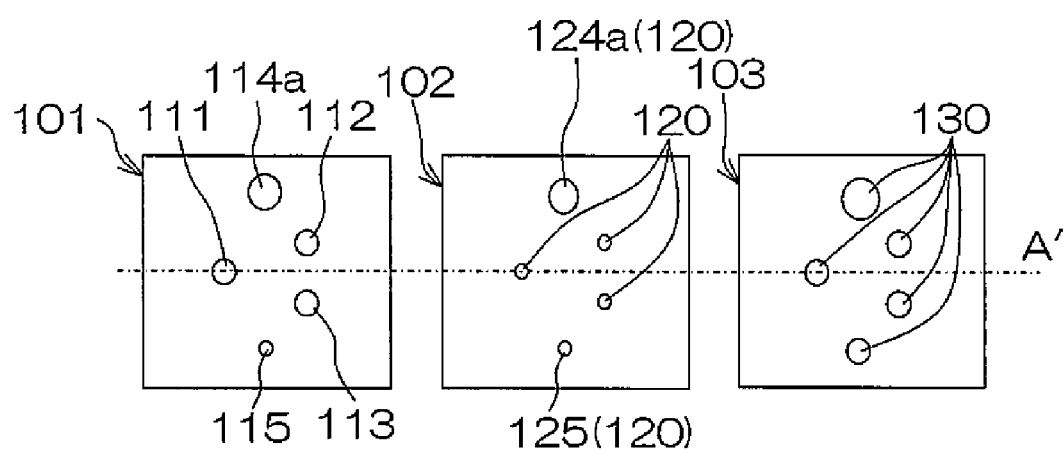
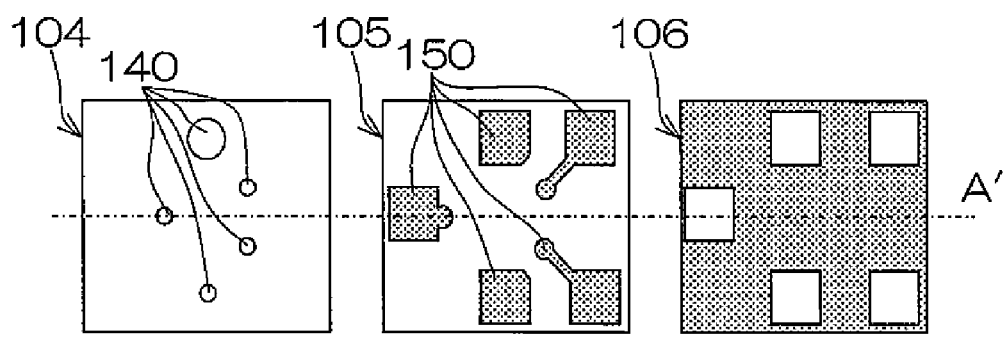

FIG. 11
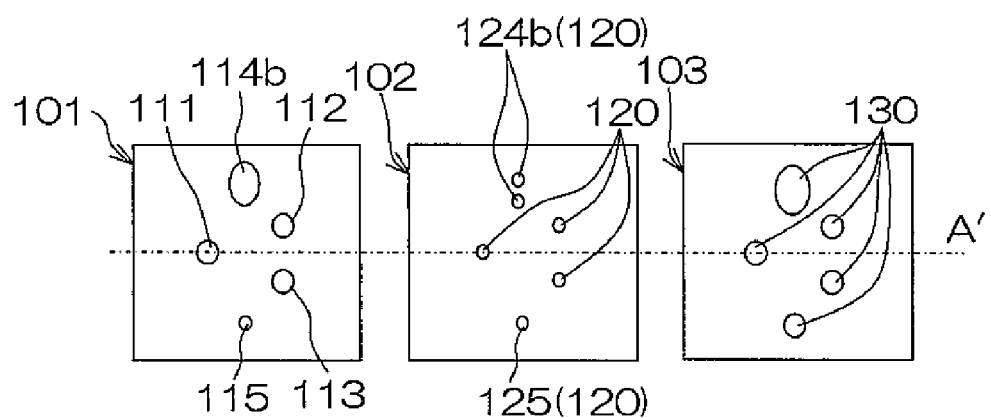
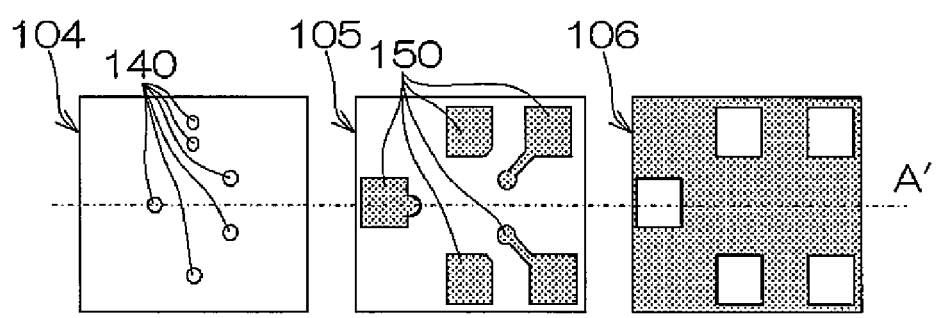

——— SURFACE ACOUSTIC WAVE DEVICE S₁
------- SURFACE ACOUSTIC WAVE DEVICE P

FIG. 28
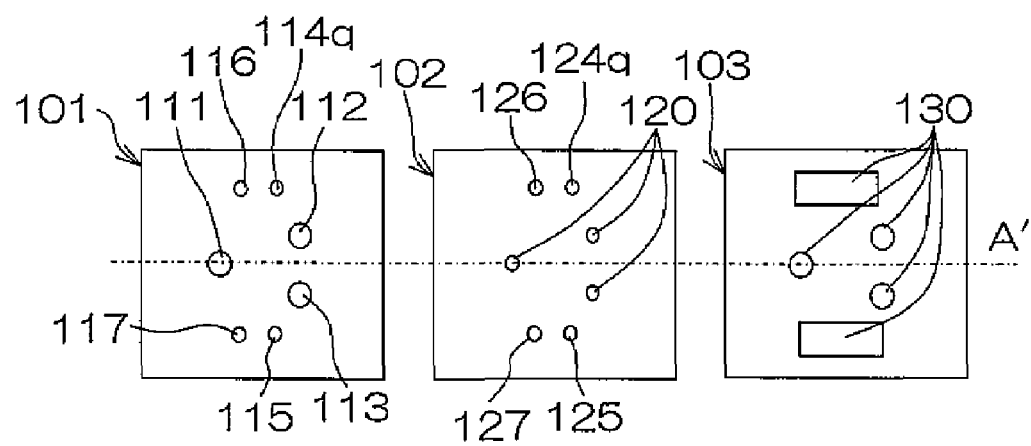
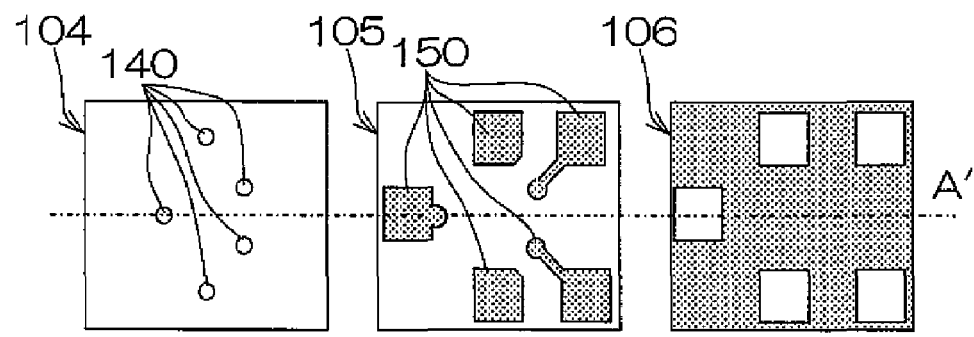

——— SURFACE ACOUSTIC WAVE DEVICE $S_2$
------- SURFACE ACOUSTIC WAVE DEVICE Q

------- SURFACE ACOUSTIC WAVE ELEMENT 930
——— SURFACE ACOUSTIC WAVE ELEMENT 930'

------- SURFACE ACOUSTIC WAVE ELEMENT 930
———— SURFACE ACOUSTIC WAVE ELEMENT 930'

SURFACE ACOUSTIC WAVE ELEMENT, SURFACE ACOUSTIC WAVE DEVICE AND COMMUNICATION DEVICE INCLUDING THE SAME

BACKGROUND OF THE INVENTION

1. Field of the Invention

The present invention relates to a surface acoustic wave element, surface acoustic wave device, and a communication device including the same. The surface acoustic wave element according to the present invention includes surface acoustic wave filter elements, surface acoustic wave resonators and the like. The surface acoustic wave device according to the present invention is used for mobile communication devices such as portable phones.

2. Description of the Related Art

Surface acoustic wave filters have been widely used as bandpass filters used for the RF (Radio Frequency; wireless frequency) stages of mobile communication devices including portable phones, automobile telephones and the like. In addition to miniaturization, adapting to wider passband and higher frequency supporting communications carriers, improvement of out-of-passband attenuation and insertion loss within the passband are required for these surface acoustic wave filters.

Recently, reduction of the number of components has been accelerated to realize miniaturized, light and low cost mobile communication devices and the like, and therefore, surface acoustic wave filters are required to have additional functions.

One of such functions is an unbalanced-balanced conversion function which allows the surface acoustic wave filter to be constructed as unbalanced input-balanced output type or balanced input-unbalanced output type.

Here, balanced input or balanced output refers to input or output of signal as an electrical potential between two signal lines, where the amplitudes are equal and the phases are opposite between the signals of the respective signal lines. On the other hand, unbalanced input or unbalanced output refers to input or output of signal as an electrical potential of one signal line with respect to the ground potential.

A major part of conventional surface acoustic wave filters are unbalanced input-unbalanced output type surface acoustic wave filters (hereinafter, simply referred to as "unbalanced type surface acoustic wave filter"). For this reason, when circuits and electronic components connected in stages subsequent to an unbalanced type surface acoustic wave filter are of balanced input type, a unbalanced-balanced converter (hereinafter, this converter is simply referred to as "balun") is required between the unbalanced type surface acoustic wave filter and the subsequent stages. Also, when circuits and electronic components in stages prior to an unbalanced type surface acoustic wave filter are of balanced output type, a balun is required between the prior stages and the unbalanced type surface acoustic wave filter.

Accordingly, in order to provide an unbalanced type surface acoustic wave filter itself with the function of a balun, development of unbalanced input-balanced output type surface acoustic wave filters produced by providing the unbalanced-balanced conversion function to this unbalanced type surface acoustic wave filter, and balanced input-unbalanced output type surface acoustic wave filters produced by providing the balanced-unbalanced conversion function has been proceeding for practical use. In addition, improving the balance degree of balanced-type surface acoustic wave filters has been proposed.

For example, in the case of a surface acoustic wave filter 900 with a multielectrode configuration shown in FIG. 32 includes three IDT (Inter Digital Transducer) electrodes 901, 902, 903 arranged along the propagation direction of surface acoustic waves. In addition, it includes reflector electrodes 904, 905 disposed to sandwich the foregoing three IDT electrodes 901, 902, 903 (Refer to Japanese Unexamined Patent Publication No. 6-204781 (1994)).

The IDT electrode 902 excites surface acoustic waves by application of an electric field from the unbalanced input terminal 906 to one of the couple of comb-shaped electrodes disposed to oppose to each other. The excited surface acoustic waves are propagated to the IDT electrodes 901, 903 located on both sides of the IDT electrode 902. Then, a signal is output from an output signal terminal 907 that is connected to one of the comb-shaped electrodes of the IDT electrode 901, and a signal is output from an output signal terminal 908 that is connected to one of the comb-shaped electrodes of the IDT electrode 903, by which the surface acoustic wave filter 900 can output balanced signals.

This structure provides the surface acoustic wave filter 900 with an unbalanced input-balanced output conversion function as a balun.

A surface acoustic wave filter 910 shown in FIG. 33 includes three IDT electrodes 911, 912, 913 arranged adjacent to each other along the propagation direction of surface acoustic waves, and reflector electrodes 914, 915 disposed to sandwich these IDT electrodes (Refer to Japanese Unexamined Patent Publication No. 11-97966 (1999)).

The IDT electrode 912 is formed by a couple of comb-shaped electrodes one of which is separated into two parts. The separated two parts of the comb-shaped electrode are connected to balanced signal terminals 916 and 917, respectively, so that they are cascade-connected acoustically and series-connected electrically to each other.

The IDT electrodes 911, 913 are each shaped so that they have the reverse polarity with respect to the IDT electrode 912, and connected to one unbalanced signal terminal 918.

This structure allows the surface acoustic wave filter 910 to have an unbalanced-balanced conversion function as a balun. In addition, the impedance (about 200Ω) on the side of the balanced signal terminals 916, 917 can be about four times the impedance (about 50Ω) on the side of the unbalanced signal terminal 918.

Japanese Unexamined Patent Publication No. 2002-84164 discloses a cascade-connected resonator type surface acoustic wave filter with a structure for improving the balance degree, which includes three IDT electrodes arranged in the surface acoustic wave propagation direction, in which the IDT electrode located at the center comprises an even number of coupled parts.

A surface acoustic wave filter 920 shown in FIG. 34 comprises an electrode pattern 941 of a surface acoustic wave element that includes three IDT electrodes 921, 922, 923 arranged adjacent to each other along the surface acoustic wave propagation direction, and reflector electrodes 924, 925 disposed to sandwich these IDT electrodes.

The IDT electrode 922 is formed by a couple of comb-shaped electrodes one of which is separated into two parts. The separated two parts of the comb-shaped electrode are each connected to balanced signal terminals 926, 927 so that they are cascade-connected acoustically and series-connected electrically.

The IDT electrodes 921, 923 are each shaped so that they have the opposite polarity with respect to the IDT electrode 922, and both of the IDT electrodes 921, 923 are connected to an unbalanced signal terminal 928.

A reactance (capacitance) component 929 is connected to the line connecting the IDT electrode 922 to the balanced signal terminal 926.

Furthermore, a surface acoustic wave filter 930 shown in FIG. 35 comprises an electrode pattern 942 including IDT electrodes 931, 932, 933 arranged adjacent to each other that are interposed between the IDT electrodes 921, 923 and the unbalanced signal terminal 928 of the foregoing surface acoustic wave filter 920 of surface acoustic wave element, and reflector electrodes 934, 935 disposed to sandwich these IDT electrodes. This electrode pattern 942 of a surface acoustic wave element and the electrode pattern 941 of a surface acoustic wave element are cascade-connected (Refer to Japanese Unexamined Patent Publication No. 2004-96244).

The IDT electrode 932 is connected to the unbalanced signal terminal 928, and the IDT electrode 931 is connected to the IDT electrode 921 through a connecting line and the IDT electrode 933 is connected to the IDT electrode 923 through a connecting line.

In this manner, the surface acoustic wave filter 930 is capable of further increasing the attenuation out of the passband as compared with the surface acoustic wave filter 920.

Besides the foregoing examples, there is another known example as in Japanese Unexamined Patent Publication No. 2003-46369, in which IDT electrodes are formed so that they are asymmetrical with respect to a virtual central axis that is perpendicular to the propagation direction of surface acoustic waves.

While the foregoing surface acoustic wave filters have been proposed so far, particularly in recent years, improvement of the amplitude balance degree and phase balance degree within the passband has been required. These amplitude balance degree and phase balance degree are measured as difference in electrical potential between two input or output signal lines. Here, "amplitude balance degree" refers to a value indicating the degree of equality between the amplitudes of signals flowing through the respective signal lines, and as the amplitudes become equal, unwanted signals are canceled because of the amplitudes approximated to each other so that the value becomes close to 0 dB, resulting in an improved amplitude balance degree. In addition, the "phase balance degree" refers to a value indicating the degree of phase inversion between two input or output signal lines, in which the closer to 180° the phase difference is, the closer to 0° is the phase balance degree, that is, the phase balance degree is improved.

Meanwhile, the surface acoustic wave element (surface acoustic wave filter) 900 (see FIG. 32) disclosed in Japanese Unexamined Patent Publication No. 6-204781 is arranged so that the phases of signals output from the IDT electrodes 901, 903 are reverse to each other. In addition, the balance at the surface acoustic wave element 900 is controllable by changing the pitch of the electrode fingers of the IDT electrodes 901-903, or changing the distance between these IDT electrodes.

However, such a structure has a drawback that the balance degree is prone to deteriorate.

In the case of the surface acoustic wave element (surface acoustic wave filter) 910 (see FIG. 33) disclosed in Japanese Unexamined Patent Publication No. 11-97966, the electrical polarity between the adjacent electrode fingers of the IDT 911 and the IDT 912 is different from that of the adjacent electrode fingers between the IDT 912 and the IDT 913. Accordingly, the parasite capacitances generated at the balanced signal terminals 916, 917 are different from each other. For this reason, the balance degree of the surface acoustic wave element 910 is degraded.

Furthermore, in the case of the surface acoustic wave element disclosed in Japanese Unexamined Patent Publication No. 2002-84164, when a LiTaO$_3$ single crystal substrate is used as the piezoelectric substrate, only an amplitude balance degree of about 1.2 dB and a phase balance degree of about 11 deg. can be achieved. As a result, this surface acoustic wave element fails to achieve a sufficient balance degree.

Meanwhile, the effect was examined on the surface acoustic wave element (surface acoustic wave filter) 930 (see FIG. 35) disclosed in Japanese Unexamined Patent Publication No. 2004-96244.

FIG. 36 is a graph showing the relationships between frequency and insertion loss of the surface acoustic wave element 930 and a surface acoustic wave element 930'.

Here, the device used as the surface acoustic wave element 930' used as comparative example was one as shown in FIG. 37 that lacked the reactance (capacitance) component 929 in the surface acoustic wave element 930.

In FIG. 36, the horizontal axis represents frequency (unit: MHz), and the vertical axis represents insertion loss (unit: dB). The broken line in the graph shows an insertion loss characteristic curve of the surface acoustic wave element 930 in FIG. 35, and the solid line in the graph shows an insertion loss characteristic curve of the surface acoustic wave element 930' shown in FIG. 37.

According to the characteristic curve (broken line) of the surface acoustic wave element 930, the ripple within the passband increases as compared with the surface acoustic wave element 930'. This is believed due to a change in transmission characteristic caused by the structure of the surface acoustic wave element 930 in which a capacitance component is parallel-connected to the balanced signal terminal 926 as the reactance component 929, by which a capacitance component is additionally parallel-connected to one of the balanced signals.

FIG. 38 is a graph showing the relationships between frequency and VSWR (Voltage Standing Wave Ratio) of the surface acoustic wave element 930 and surface acoustic wave element 930'.

In FIG. 38, the horizontal axis represents frequency (unit: MHz), and the vertical axis represents VSWR. The broken line in the graph shows a characteristic curve of the surface acoustic wave element 930 shown in FIG. 35, and the solid line in the graph shows a characteristic curve of the surface acoustic wave element 930' shown in FIG. 37.

According to the characteristic curve (broken line) of the surface acoustic wave element 930, VSWR is deteriorated as compared with that of the surface acoustic wave element 930'. This is believed due to a change in reflection characteristic of the surface acoustic wave caused by the addition of the capacitance component (reactance component 929) parallel-connected to one of the balanced signals.

FIG. 39(a) is a graph showing amplitude balance degrees in the vicinity of the passband of the surface acoustic wave element 930 and surface acoustic wave element 930', and FIG. 39(b) is a graph showing phase balance degree in the vicinity of the passband of the surface acoustic wave element 930 and surface acoustic wave element 930'.

In FIG. 39(a), the horizontal axis represents frequency (unit: MHz), and the vertical axis represents amplitude balance degree (unit: dB). In FIG. 39(b), the horizontal axis represents frequency (unit: MHz), and the vertical axis represents phase balance degree (unit: deg.). In addition, the broken lines in the graphs show characteristic curves of the surface acoustic wave element 930 shown in FIG. 35 (the upper and lower broken lines reflect two different levels of reactance component 929), the solid lines in the graphs show the results of measurements on the surface acoustic wave element 930' shown in FIG. 37.

According to FIG. 39(*a*), the surface acoustic wave element 930 has values more distant from 0 dB than those of surface acoustic wave element 930', i.e., the amplitude balance degrees are not good. This is believed because even when a capacitance component (reactance component 929) is parallel-connected and added to the balanced signal in the surface acoustic wave element 930, the difference in amplitude cannot be compensated.

In addition, according to FIG. 39(*b*), the surface acoustic wave element 930 has values more distant from 0 deg. than those of surface acoustic wave element 930', i.e., the phase balance degrees are not good. This is believed because even when a capacitance component is parallel-connected to the balanced signal in the surface acoustic wave element 930, the difference in phase cannot be compensated.

As shown in FIGS. 36, 38 and 39, no significant improvements are observed in terms of insertion loss, VSWR, amplitude balance degree, and phase balance degree about the surface acoustic wave element 930 despite the addition of a capacitance component as reactance component 929 parallel-connected to one balanced signal terminal 926, and some characteristics are even degraded.

SUMMARY OF THE INVENTION

With the foregoing background, it is an object of the present invention to provide a surface acoustic wave element that functions as a high quality surface acoustic wave filter with reduced insertion loss and VSWR by minimizing deterioration of amplitude balance and phase balance of surface acoustic wave element, a surface acoustic wave device and a communication device using the same.

A surface acoustic wave element for achieving the foregoing object comprises a piezoelectric substrate, and an IDT electrodes of an odd number not less than three formed along a propagation direction of surface acoustic waves propagating on the piezoelectric substrate, wherein IDT electrodes of the odd number of IDT electrodes disposed on both sides of an IDT electrode that is located at the center are each connected to a first reference potential terminal and a second reference potential terminal, and the first and second reference potential terminals are formed asymmetrically with respect to a virtual central axis that passes through the center of the IDT electrode located at the center and provided in a direction perpendicular to the propagation direction.

In this structure, disposing the first and second reference potential terminals asymmetrically is equivalent to a condition where inductance components are connected to reference potential terminals of the surface acoustic wave element. Accordingly, this structure has the same effect as in the case where a matching circuit is connected to connecting terminals, so that the insertion loss and VSWR of the surface acoustic wave element can be reduced.

When one of a couple of comb-shaped electrodes of the odd number of IDT electrodes constituting the IDT electrode located at the center is separated into at least two parts, and connecting terminals are connected to each of the separated comb-shaped electrodes, a surface acoustic wave device including the surface acoustic wave element mounted on a mounting board can have the function of an unbalanced-balanced converter. In addition, since there is no parasite capacitance added on the connecting terminal side of the surface acoustic wave device with this structure, deterioration of the amplitude balance degree and phase balance degree can be reduced.

At least one surface acoustic resonator may be connected between the connecting terminals and the odd number of IDT electrodes. By this arrangement, the surface acoustic wave device has a structure including a plurality of surface acoustic wave elements cascade-connected to one another, so that signals out of the desired passband can be further attenuated. Accordingly, a surface acoustic wave device including these surface acoustic elements is advantageously capable of extracting signals in the desired passband.

The foregoing reference potential terminals are preferably formed such that they are different in at least one of position, shape and area so that they are asymmetric with respect to the virtual central axis.

In addition, the magnitudes of the inductance components generated at the respective first and second reference potential terminals are preferably 0.1-0.3 nH.

The difference in magnitude between the inductance components generated at the respective first and second reference potential terminals is preferably 0.1-0.2 nH.

In addition, a surface acoustic wave element according to the present invention may be one that comprises reflector electrodes that are disposed on both sides of the odd number of IDT electrodes and each have a plurality of finger electrodes formed in a direction perpendicular to the propagation direction.

A surface acoustic wave device according to the present invention comprises a surface acoustic wave element with the foregoing structure and a mounting board for mounting the surface acoustic wave element thereon, wherein the mounting board includes first and second ground conductors disposed to oppose to the first and second reference potential terminals.

It is preferred that the foregoing first and second ground conductors are formed asymmetrical with respect to the virtual central axis.

Specifically, the foregoing first and second ground conductors are formed such that they are different in at least one of position, shape and area so as to be asymmetrical with respect to the virtual central axis.

According to this structure, in the surface acoustic wave device including the surface acoustic wave element mounted on the mounting board, disposing the first and second ground conductors asymmetrically has the same effect as in the case where a matching circuit is connected to connecting terminals. This reduces deterioration of the amplitude balance degree and phase balance degree of this surface acoustic wave device, and as a result, the insertion loss and VSWR of the surface acoustic wave device can be reduced.

In addition to the surface acoustic wave device with the foregoing structure, it may be one that includes first and second ground through conductors that are connected from the foregoing first and second ground conductors so as to penetrate the mounting board, wherein the first and second ground through conductors are formed asymmetrically with respect to the virtual central axis.

A communication device according to the present invention comprises at least one of a signal-receiving circuit and a signal-transmitting circuit that includes the foregoing surface acoustic wave device. With this communication device, a surface acoustic wave device according to the present invention can be advantageously applied to radio frequency circuits of mobile communication devices and the like.

For example, radio frequency signals transmitted from a portable phone, after unwanted signals thereof are removed by a surface acoustic filter, are amplified by a power amplifier, and then pass through an isolator and a duplexer including a surface acoustic wave device of the present invention to be radiated from an antenna. On the other hand, radio frequency signals received by the antenna are separated by the foregoing duplexer, then amplified by a low noise amplifier, and after unwanted signals thereof are removed by the surface acoustic wave filter, they are amplified again by an amplifier, and then converted into low frequency signals by a mixer.

As discussed above, by applying a surface acoustic wave device of the present invention to a duplexer of a communication device, it is possible to provide a communication device with good radio frequency characteristics.

These and other advantages, features and effects will be apparent from the following description of specific embodiments with reference to the accompanying drawings.

BRIEF DESCRIPTION OF THE DRAWING

In the drawings below, the sizes of electrodes, distances between electrodes, the numbers of electrode fingers and pitches are schematically drawn for illustration purpose.

FIG. 10 is a plan view showing respective layers of a first modification of the mounting board according to the first embodiment shown in FIG. 2.

FIG. 11 is a plan view showing respective layers of a second modification of the mounting board according to the first embodiment shown in FIG. 2.

FIG. 28 is a plan view showing respective layers of a mounting board included in a surface acoustic wave device as comparative example.

DETAILED DESCRIPTION OF PREFERRED EMBODIMENTS

Figure 1:
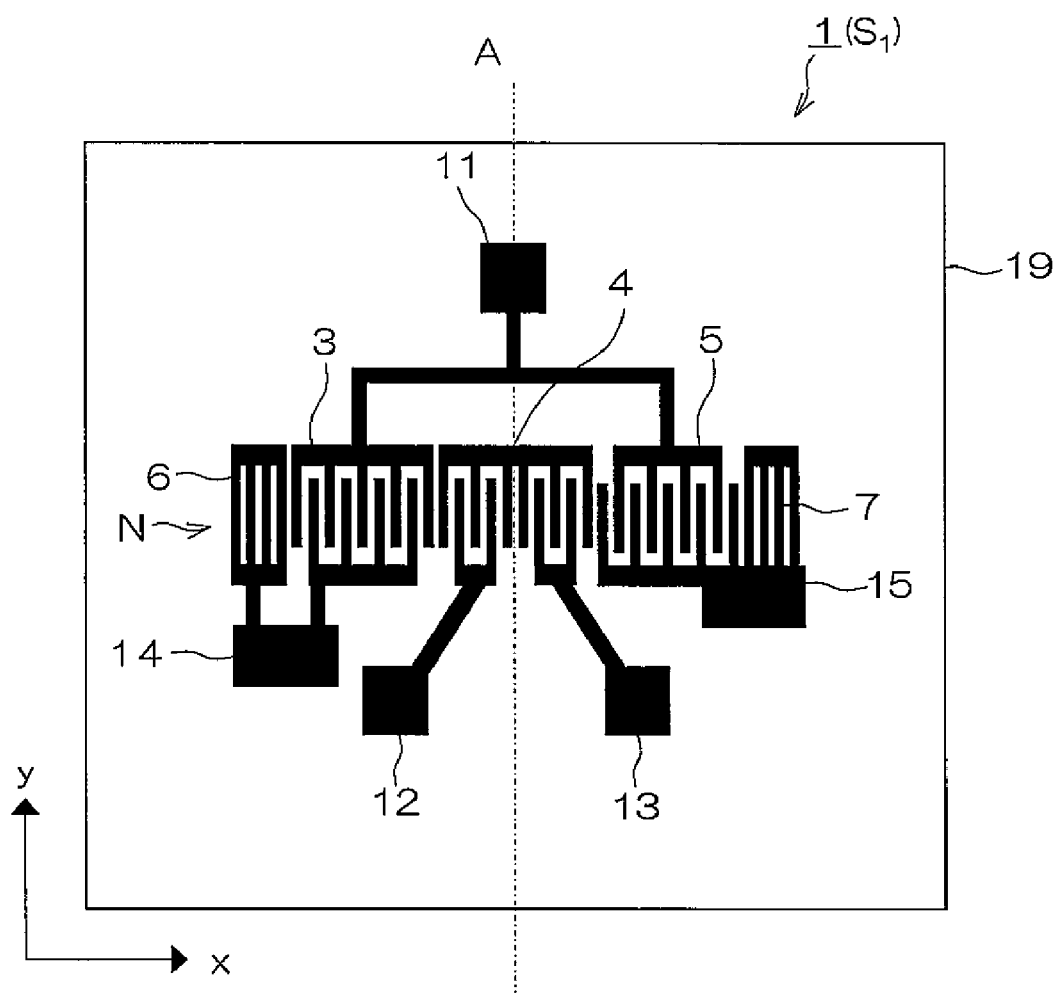
FIG. 1 is a plan view showing a first embodiment of a surface acoustic wave element included in a surface acoustic wave device according to one embodiment of the present invention.
Figure 2:
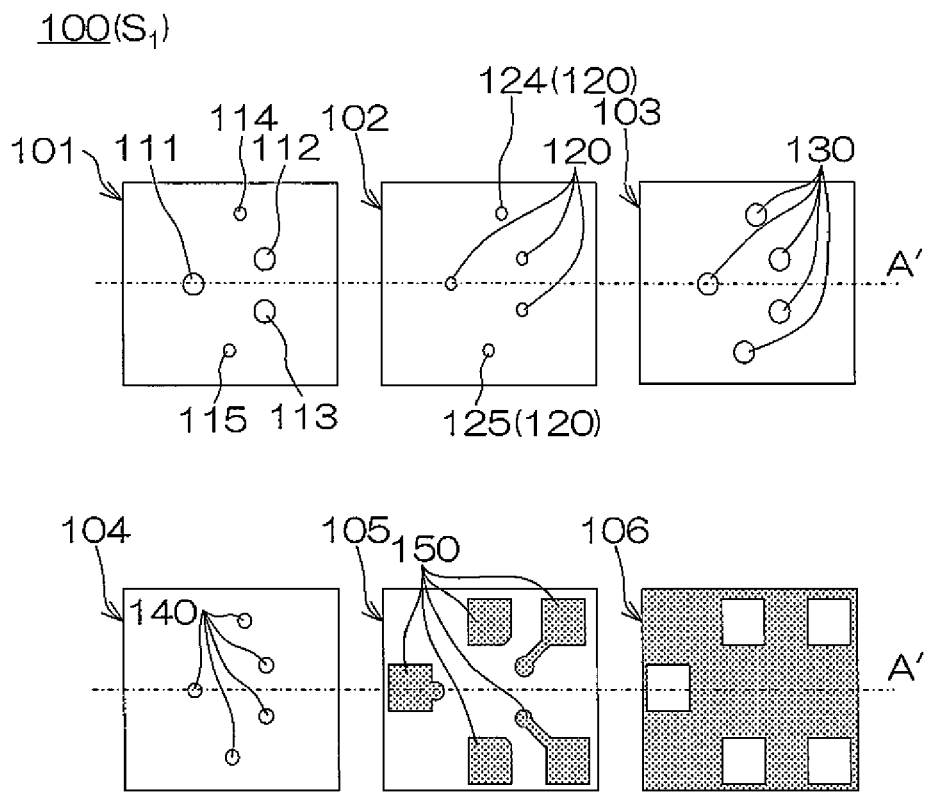
FIG. 2 is a plan view showing respective layers of a first embodiment of a mounting board included in a surface acoustic wave device according to one embodiment of the present invention.

FIG. 1 is a plan view showing a first embodiment of a surface acoustic wave element according to the present invention. FIG. 2 is a plan view showing respective layers of a mounting board for mounting the foregoing surface acoustic wave element, and FIG. 3 is a cross-sectional view of a laminated mounting board.

Figure 3:
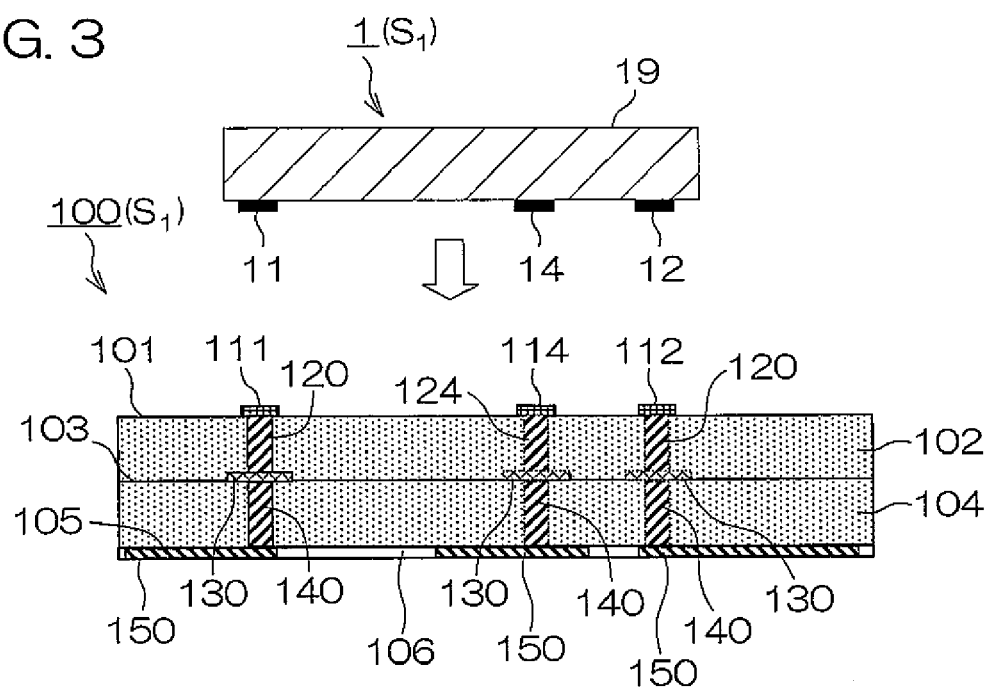
FIG. 3 is a cross-sectional view of a laminated mounting board.

A surface acoustic wave device S1 has a structure including the surface acoustic wave element 1 shown in FIG. 1 mounted on a mounting board 100 shown in FIG. 3.

Meanwhile, the "principal surface" in this specification refers to a surface of a sheet-like formed piezoelectric substrate 19, which is the surface on which electrode patterns and the like are formed.

In addition, on the piezoelectric substrate 19, the axis extending in the surface acoustic wave propagation direction is designated as X axis, and the axis perpendicular to the X axis is designated as Y axis.

The surface acoustic wave element 1 comprises, as shown in FIG. 1, a piezoelectric substrate 19, an electrode pattern N of the surface acoustic wave element, connection terminals 11, 12, 13 for signal input/output, first and second reference potential terminals 14, 15 disposed on the principal surface of the piezoelectric substrate 19 (hereinafter connecting terminals 11-13 and reference potential terminals 14, 15 are collectively referred to as "terminals 11-15").

For the first and second reference potential terminals 14, 15 that can provide reference potential of a driving reference to the surface acoustic wave element 1, since the ground terminals are used as reference potential in the description of the following embodiment, the first and second reference potential terminals 14, 15 are referred to as ground terminals 14, 15.

The electrode pattern N of the surface acoustic wave element includes three IDT electrodes (IDT (Inter Digital Transducer) electrodes) 3, 4, 5 each including a couple of comb-shaped electrodes juxtaposed in the X-axis direction. Each of the comb-shaped electrodes has a plurality of electrode fingers formed along the Y axis direction. One IDT electrode is formed by engaging the electrode fingers of a couple of comb-shaped electrodes with each other. On both sides of the three IDT electrodes 3-5, reflector electrodes (hereinafter also referred to as reflector) 6, 7 each having a plurality of electrode fingers formed along the Y axis are disposed.

In the IDT electrodes 3-5, the IDT electrode 4 located at the center has one of the couple of comb-shaped electrodes separated into two parts, and the separated two parts of the comb-shaped electrode of the IDT electrode 4 are connected to the connection terminals 12, 13 as balanced signal terminals, respectively.

The IDT electrodes 3, 5 located at both sides each have one of the couple of comb-shaped electrodes connected to the connecting terminals 11 as unbalanced signal terminal. The other one of the couple of comb-shaped electrodes of the IDT electrode 3 and the reflector 6 are connected to the ground terminal 14, and the other one of the couple of comb-shaped electrodes of the IDT electrode 5 and the reflector 7 are connected to the ground terminal 15.

The piezoelectric substrate 19 is formed using a material with great piezoelectricity such as lithium tantalite single crystal, lithium niobate single crystal, lithium tetraborate single crystal or the like. By using such material, the electromechanical coupling coefficient of the piezoelectric substrate 19 can be increased, as well as the group delay time temperature coefficient can be decreased.

In addition, when these materials are subjected to a process to cause oxygen defect or solid solution treatment with Fe or the like, the pyroelectric effect generated at the piezoelectric substrate 19 can be greatly reduced. This makes it possible to prevent static damage from occurring in the formation of electrode fingers of the IDT electrodes 3-5 on the principal surface of the piezoelectric substrate 19. As a result, the reliability of the surface acoustic wave element 1 can be well maintained.

The piezoelectric substrate 19 preferably has a thickness of about 0.1-0.5 mm. By this, the piezoelectric substrate 19 can avoid being brittle unlike when it is formed thin to have a thickness of less than 0.1 mm, and the material cost can be prevented from being high unlike when it is formed thick to have a thickness greater than 0.5 mm, so that the size of the surface acoustic wave element 1 can be prevented from being great.

The electrode pattern N and terminal patterns (hereinafter, various electrode patterns and terminal patterns formed on the principal surface of the piezoelectric substrate 19 are collectively referred simply to as "electrode patterns") of the surface acoustic wave element formed on the piezoelectric substrate 19 are produced by forming metal patterns such as Al or Al alloy (for example, Al—Cu alloy, Al—Ti alloy) patterns using a thin film deposition process such as vapor deposition, sputtering, CVD (Chemical Vapor Deposition) method or the like.

In addition, the electrode patterns are covered with a protective film (not shown) made of semiconductor or insulator such as Si, $SiO_2$, SiNx, $Al_2O_3$ or the like. This protective film prevents electrical short circuit due to adhesion of conductive foreign objects to the electrode patterns, so that the power handling capability can be improved. This protective film can be formed using a thin film deposition process such as vapor deposition, sputtering or the like after the formation of the IDT electrodes 3-5 and reflectors 6, 7.

By forming the IDT electrodes 3-5 to have a thicknesses of about 0.1 μm-0.5 μm, the surface acoustic waves can be excited in a suitable manner.

Meanwhile, the mounting board 100 on which the surface acoustic wave element 1 is mounted has a structure, as shown in FIGS. 2 and 3, which includes an upper surface layer 101 that is opposed to the surface acoustic wave element 1 to be joined thereto, a first through conductor layer 102 in which through conductors 120 as via holes are formed, an internal electrode pattern layer 103, a second through conductor layer 104 in which through conductors 140 are formed, a lower surface electrode pattern layer 105 and a lower surface dielectric layer 106 laminated together.

On the upper surface layer 101, there are provided connecting pad conductors 111, 112, 113 formed at the positions opposed to the connecting terminals 11, 12, 13, respectively, and ground conductors 114, 115 formed at the positions opposed to the ground terminals 14, 15, respectively (hereinafter, the connection pad conductors 111-113 and ground conductors 114, 115 are collectively referred to as "conductors 111-115").

The first through conductor layer 102 is provided with through conductors 120 connected to the connecting pad conductors 111-113 and the ground through conductors 124, 125 connected to the ground conductors 114, 115, respectively (hereinafter, these are collectively referred to as "through conductors 120").

On the internal electrode pattern layer 103, an internal electrode pattern 130 connected to the through conductors 120 is formed.

The second through conductor layer 104 is formed with through conductors 140 connected to the internal electrode pattern 130.

On the lower surface electrode pattern layer 105, a lower surface electrode pattern 150 connected to the through conductors 140 is formed.

The mounting board 100 is constructed by laminating a plurality of insulating layers made of an insulating material. Specifically, the layers 101-106 of the mounting board 100 are formed using an insulating material such as ceramics, glass ceramics or the like. A metal oxide comprising ceramics or the like and an organic binder are mixed and kneaded homogeneously with an organic solvent to produce a slurry, which is formed into sheet-like green sheets, and then patterns including through conductors and the like are formed. Thereafter, these green sheets are laminated and pressure-bonded together to form an integral body, which is then baked, thereby producing the mounting board 100.

The conductors 111-115, the internal electrode pattern 130 and the lower surface electrode pattern 150 are formed into the desired patterns by using conductive materials such as Au, Cu, Ag, Ag—Pd, W or the like, which are deposited through a film deposition process such as screen printing and etching, while conductive layers are formed by stacking these materials successively from the bottom layer by electroplating or electroless plating.

The through conductors 120, 140 are formed using a conductive material such as Ag. Through-holes are formed at predetermined positions of the green sheet by means of microdrilling, punching, laser processing, die punching, photolithography or the like. Then conductive paste including Ag or the like is filled into these through-holes thereby to form the though conductors 120, 140.

On the conductors 111-115, a joining layer including fusible conductor such as solder paste, Au—Sn paste or the like is formed by means of a printing process such as screen printing or dispenser for mounting the surface acoustic wave element 1 on the mounting board 100.

Although the joining layer is formed on the conductors 111-115 of the mounting board 100 in the foregoing description, it may be formed on the terminals 11-15 of the surface acoustic wave element 1. In this case, the joining layer can be formed on the terminals 11-15 through the same process as described above.

A method for mounting the surface acoustic wave element 1 on the mounting board 100 will be hereinafter described.

The surface acoustic wave element 1 is formed with an annular electrode (not shown) in the form of a square frame in such a manner that it surrounds the electrode patterns including IDT electrodes 3-5 and the reflectors 6,7 on the principal surface of the piezoelectric substrate 19.

Meanwhile, on the mounting board 100 for mounting the surface acoustic wave element 1, an annular conductor (not shown) is formed continuously at a position opposed to the annular electrode on the surface acoustic wave element 1.

In mounting the surface acoustic wave element 1 on the mounting board 100, the principal surface side of the piezoelectric substrate 19 of the surface acoustic wave element 1 is face-down mounted on the upper surface layer 101 of the mounting board 100. In other words, the principal surface of the piezoelectric substrate 19 in the surface acoustic wave element 1 and the upper surface layer 101 of the mounting board 100 are disposed to oppose to each other. Then, the connecting terminals 11-13 and ground conductors 14, 15 are joined to the connection pad conductors 111-113 and ground conductors 114, 115, respectively, through the joining layer, thereby completing the mounting of the surface acoustic wave element 1 on the mounting board 100. This structure allows the surface acoustic wave element 1 mounted on the mounting board 100 to be electrically connected to other circuit members that are connected to the mounting board 100.

In addition, the annular electrode on the surface acoustic wave element 1 is joined to the annular conductor on the mounting board 100 through the joining layer. As a result, the IDT electrodes 3-5 and reflectors 6, 7 are hermetically sealed within a space enclosed by the principal surface of the piezoelectric substrate 19, the upper surface layer 101 of the mounting board 100 and the annular electrode.

Thereafter, the perimeter of the surface acoustic wave element 1 that has been mounted on the mounting board 100 is sealed with resin. This is provided to prevent air with high humidity from entering the hermetically sealed space, as well as to enhance the mechanical strength of the surface acoustic wave device S1. The resin used here may be, namely, a thermosetting resin such as epoxy resin and polyimide resin, a thermoplastic resin such as polyphenylene sulfide resin, UV curable resin, low-melting-point glass or the like. This sealing resin is applied on the surface acoustic wave element 1 by potting or printing, and then cured.

In the foregoing way, by mounting the surface acoustic wave element 1 on the mounting board 100, the surface acoustic wave device S1 is fabricated.

The mounting structure of the surface acoustic wave device according to the present invention is not limited to the foregoing embodiment. For example, it may be a surface acoustic wave device without having the sealed structure surrounded by the annular electrode described above.

As shown in FIG. 1, the ground terminal 14 and ground terminal 15 of the surface acoustic wave element 1 are disposed asymmetrically with respect to the virtual central axis A (hereinafter, also simply referred to as "A axis") that passes through the center of the IDT electrode 4 located at the center and extends in the direction of Y axis that is perpendicular to the aforementioned propagation direction.

Also, the ground conductor 114 and ground conductor 115 of the mounting board 100 that correspond to the ground terminal 14 and ground terminal 15, respectively, are disposed asymmetrically with respect to the A' axis as shown in FIG. 2, and the ground through conductor 124 and ground through conductor 125 corresponding to the ground terminal 14 and ground terminal 15, respectively, are also disposed asymmetrically with respect to the A' axis.

The A' axis of the mounting board 100 shown in FIG. 2 is an axis that coincides with the A axis of the surface acoustic wave element 1 shown in FIG. 1 when the surface acoustic wave element 1 is mounted on the mounting board 100.

The surface acoustic wave device S1 comprising the surface acoustic wave element 1 mounted on the mounting board 100 has the function of an unbalanced-balanced converter.

Figure 4:
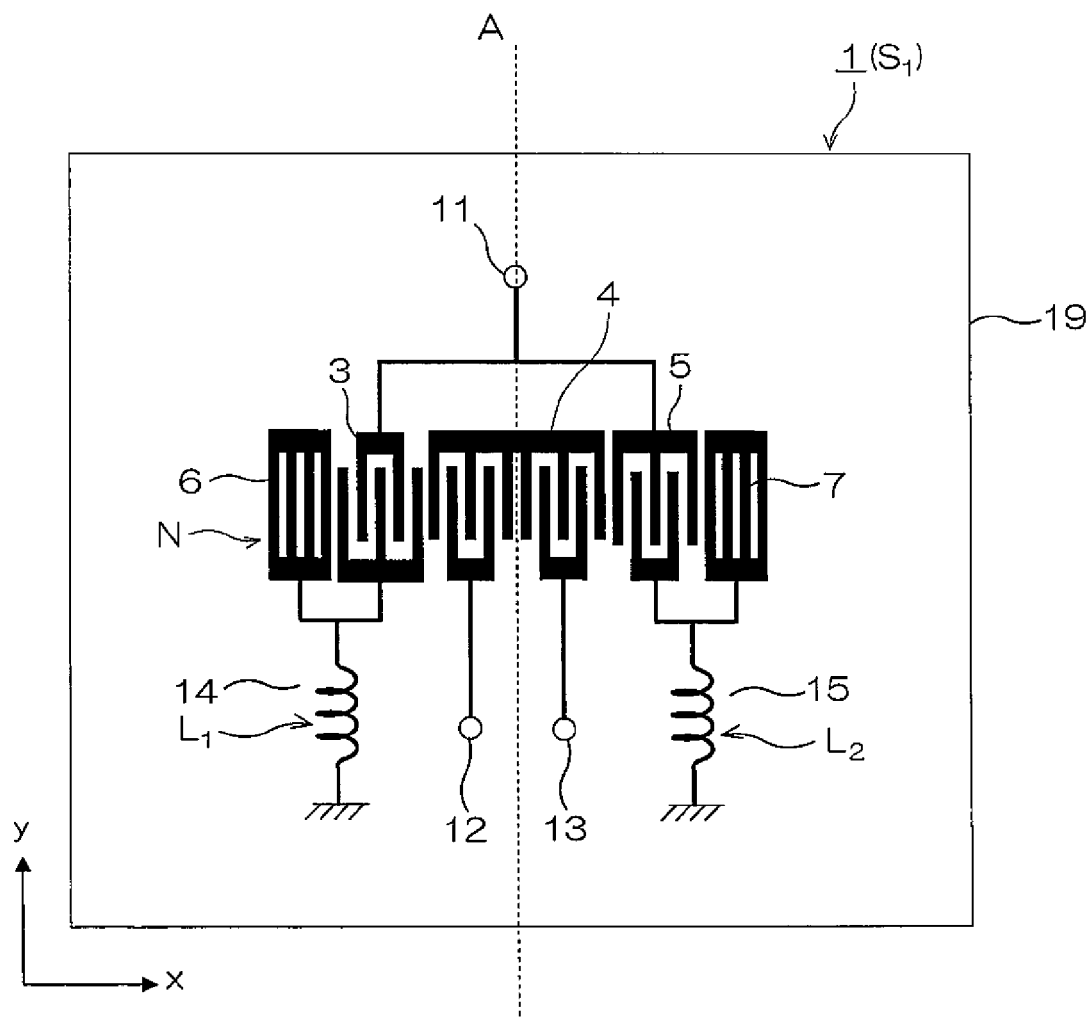
FIG. 4 is an equivalent circuit diagram of the surface acoustic wave element 1 in FIG. 1.

Furthermore, the ground terminals 14, 15 are disposed asymmetrically with respect to the A axis, and the ground conductors 114 and 115, and ground through conductors 124 and 125 are disposed asymmetrically with respect to the A' axis. By this arrangement, as the equivalent circuit diagram in FIG. 4 shows, inductance components L1, L2 are added to the ground terminals 14, 15 of the surface acoustic wave element 1. The value of L1 is preferably not less than 0.1 nH and not more than 0.3 nH, and also the value of L2 is preferably not less than 0.1 nH and not more than 0.3 nH. The absolute value |L1−L2| of the difference between L1 and L2 is preferably not less than 0.1 nH and not more than 0.2 nH. When the absolute difference value |L1−L2| is less than 0.1 nH, the following effect will be insufficient that "the advantageous effect of the condition where inductance components are connected to the ground terminals of the surface acoustic wave element, which has the same effect as when a matching circuit is connected to the connecting terminals that enables reduction of the insertion loss and VSWR of the surface acoustic wave element". When the absolute difference value |L1−L2| is greater than 0.2 nH, the inductance components connected to the ground terminals of the surface acoustic wave element are so great that the balance degree is deteriorated.

This circuit structure has the same effect as when a matching circuit is connected to the connecting terminals 12, 13. That is, the insertion loss of the surface acoustic wave element 1 can be reduced and the VSWR thereof can be closer to 1.

Since this structure includes no parasite capacitance on the side of the connecting terminals 12, 13, deterioration of the amplitude balance degree or phase balance degree of the surface acoustic wave element 1 will not be caused.

Figure 5:
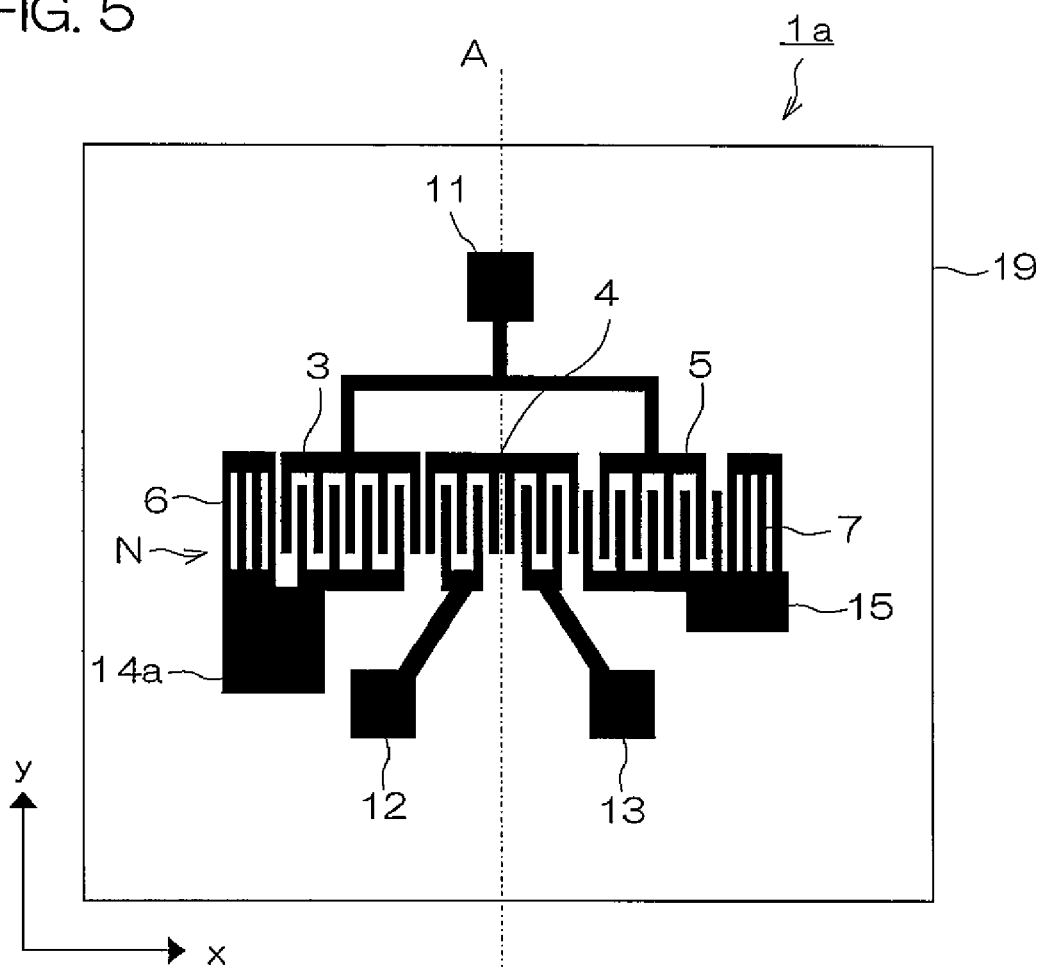
FIG. 5 is a plan view showing a first modification of the surface acoustic wave element according to the first embodiment.

FIG. 5 is a plan view showing a first modification of the first embodiment of the surface acoustic wave element.

When compared with the surface acoustic wave element 1 shown in FIG. 1, in this surface acoustic wave element 1a according to the modification example, the ground terminal 14a connected to the IDT electrode 3 and reflector 6 has a larger area than that of the ground terminal 15 connected to the IDT electrode 5 and reflector 7.

The surface acoustic wave device mounting this surface acoustic wave element 1a thereon is arranged such that the area ratio between the ground terminals 14a and 15 is large so that inductance components with larger difference can be added to the wiring routes of the ground terminals 14a, 15. This reduces the possibility of deterioration of the balance degree of the surface acoustic wave device including the surface acoustic wave element 1a, and as a result, the insertion loss and VSWR of the surface acoustic wave device can be reduced.

Figure 6:
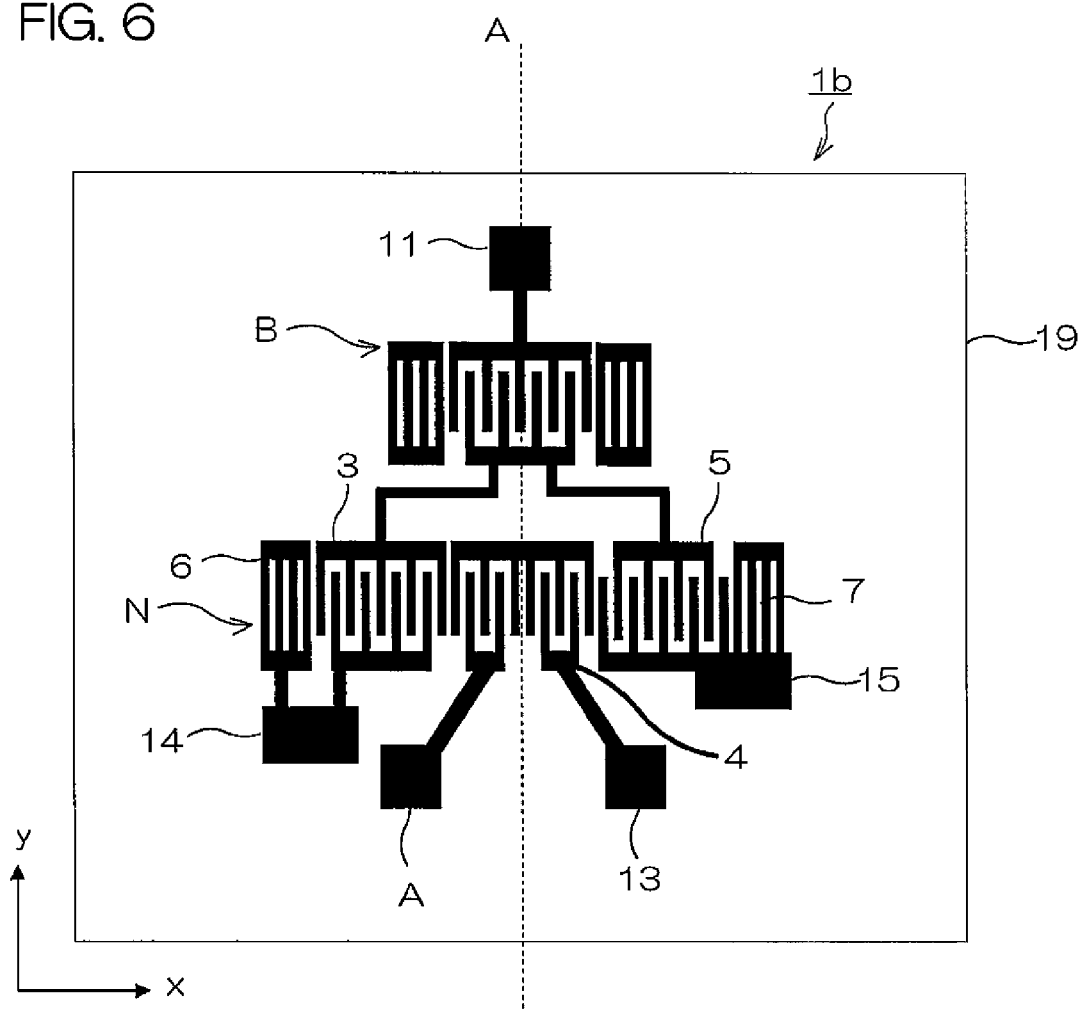
FIG. 6 is a plan view showing a second modification of the surface acoustic wave element according to the first embodiment.

FIG. 6 is a plan view showing a second modification of the surface acoustic wave element according to the first embodiment.

The surface acoustic wave element 1b has a configuration including a surface acoustic wave resonator B connected between the connecting terminal 11 and the electrode pattern N of the surface acoustic wave element in the surface acoustic wave element 1 shown in FIG. 1.

The surface acoustic wave resonator B comprises one or more IDT electrodes having a plurality of electrode fingers formed along the Y axis direction and reflector electrodes that are disposed on both sides of the IDT electrode and have a plurality of electrode fingers formed along the Y axis direction. Because of this structure, the surface acoustic wave resonator B resonates in one or more resonance modes.

By series-connecting this surface acoustic wave resonator B to the electrode pattern N, the anti-resonance frequency of the surface acoustic wave resonator B corresponds to the anti-resonance frequency of the surface acoustic wave element 1b and the degree of impedance matching within the passband is improved, so that the insertion loss within the passband is greatly decreased. In addition, by making the anti-resonance frequency of the surface acoustic wave resonator B generally equal to the cut off frequency on the higher frequency side of the surface acoustic wave element 1b, an attenuation pole by the surface acoustic wave resonator B is formed in the frequency characteristic of the surface acoustic wave element 1b, so that the attenuation outside the passband can be further increased.

Accordingly, the surface acoustic wave device including the surface acoustic wave element 1b is capable of further reducing deterioration of the balance degree within the passband, making it possible to further reduce the insertion loss and VSWR.

While the surface acoustic wave resonator B is series-connected to the electrode pattern N in the embodiment shown in FIG. 6, it may be parallel-connected.

Figure 7:
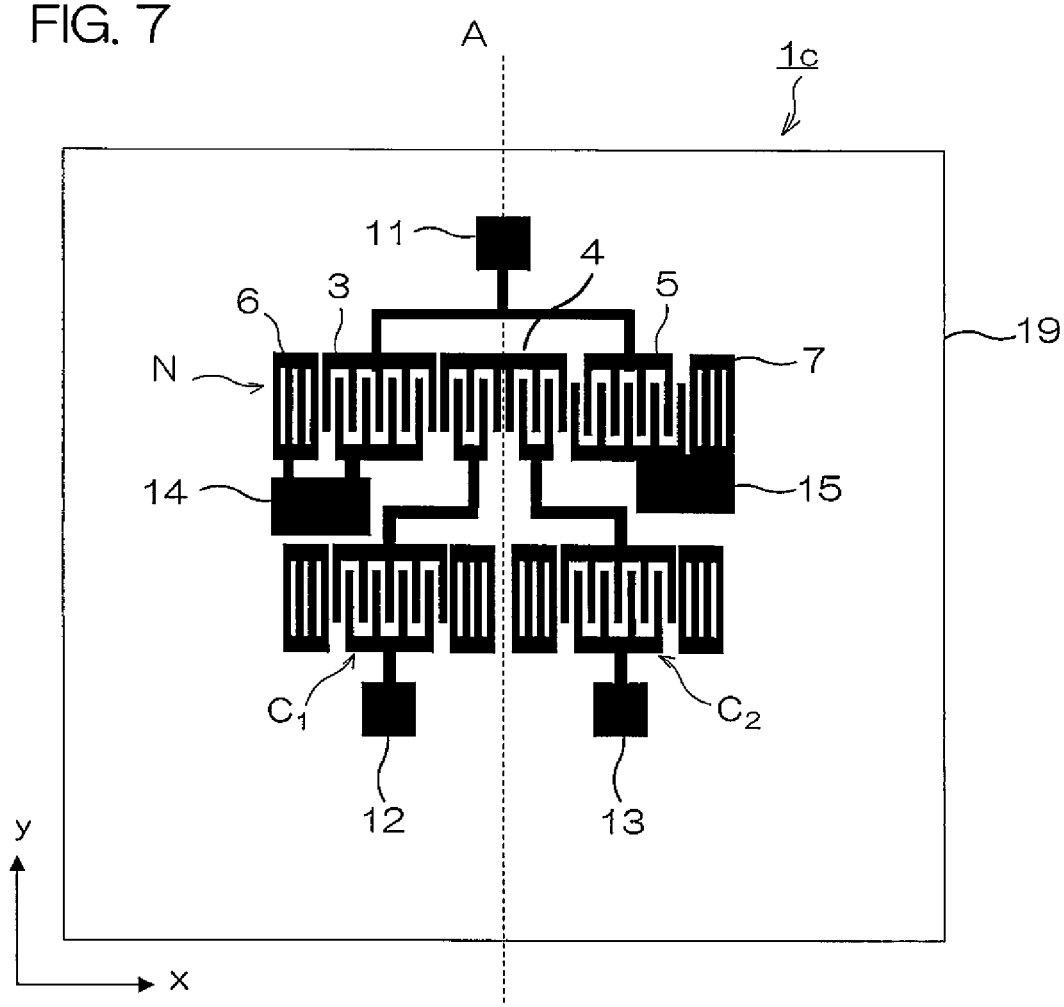
FIG. 7 is a plan view showing a third modification of the surface acoustic wave element according to the first embodiment.

FIG. 7 is a plan view showing a third modification of the surface acoustic wave element according to the first embodiment.

This surface acoustic wave element 1c has a configuration including surface acoustic wave resonators C1, C2, which are connected between the electrode pattern N and the connecting terminal 12, and between the electrode pattern N and the connecting terminal 13, respectively, of the surface acoustic wave element in the surface acoustic element 1 shown in FIG. 1.

The surface acoustic wave resonators C1, C2 each comprises one or more IDT electrodes having a plurality of electrode fingers formed along the Y axis direction and reflector electrodes that are disposed on both sides of the IDT electrode and have a plurality of electrode fingers formed along the Y axis direction.

With this structure, the surface acoustic wave element 1c is capable of reducing deterioration of the balance degree within the passband, making it possible to further reduce the insertion loss and VSWR.

While the surface acoustic wave resonators C1, C2 are series-connected to the electrode pattern N in the embodiment shown in FIG. 7, the surface acoustic wave resonators C1, C2 may be parallel-connected to the electrode pattern N.

Figure 8:
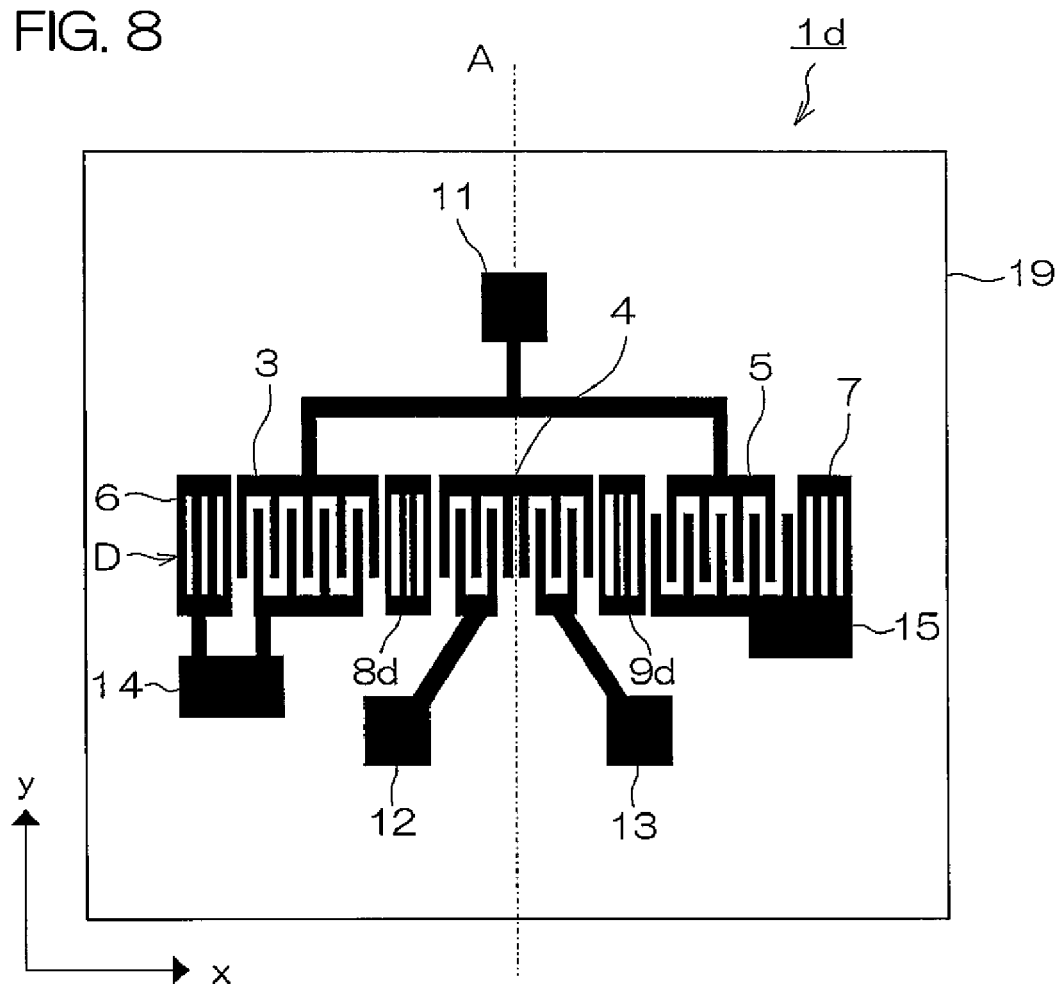
FIG. 8 is a plan view showing a fourth modification of the surface acoustic wave element according to the first embodiment.

FIG. 8 is a plan view of a fourth modification of the surface acoustic wave element according to the first embodiment.

The surface acoustic wave element 1d according to this modification has an electrode pattern D in which insertion reflectors 8d, 9d are inserted into the electrode pattern N of the surface acoustic wave element shown in FIG. 1.

The electrode pattern D of this surface acoustic wave element has a configuration in which insertion reflectors 8d, 9d having a plurality of long electrode fingers in the Y axis direction are provided between the IDT electrodes (between the IDT electrodes 3 and 4, and between the IDT electrodes 4 and 5, respectively) of the electrode pattern N of the surface acoustic wave element shown in FIG. 1. The insertion reflectors 8d, 9d are each formed such that the distance between the centers of adjacent electrode fingers gradually becomes narrower from the both ends to the center thereof.

With this surface acoustic wave element 1d, since it is possible to control a period of multi standing wave modes generated from surface acoustic waves exited at the IDT electrode 4 by varying the pitch of the electrode fingers of the insertion reflectors 8d, 9d, frequencies to be filtered can be controlled. For this reason, the surface acoustic wave device including this surface acoustic wave element 1d can achieve good electrical characteristics with wider passband and lower loss.

Figure 9:
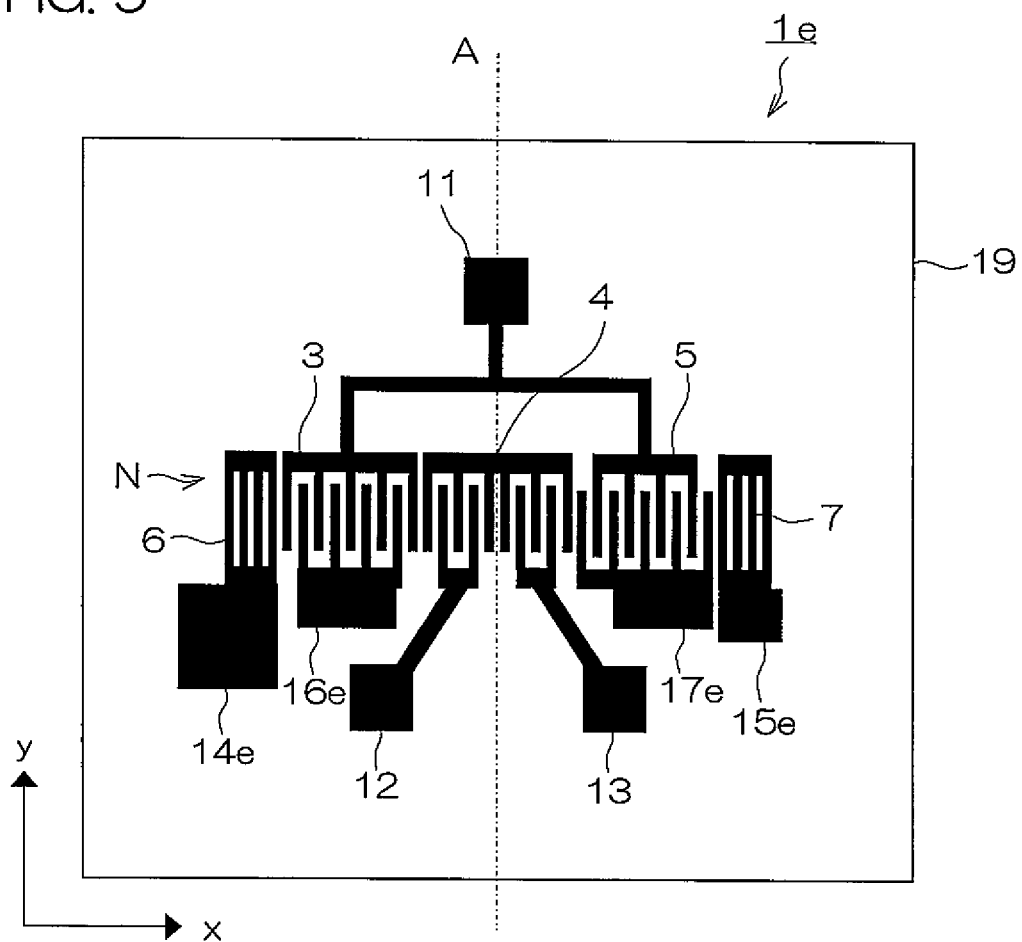
FIG. 9 is a plan view showing a fifth modification of the surface acoustic wave element according to the first embodiment.

FIG. 9 is a plan view showing a fifth modification of the surface acoustic wave element according to the first embodiment.

The surface acoustic wave element 1e according to this modification, as compared with the surface acoustic wave element 1 in FIG. 1, further includes ground terminals 16e, 17e connected to the IDT electrodes 3, 5, respectively, which are disposed symmetrically with respect to the A axis.

On the other hand, ground terminals 14e, 15e connected to the reflector electrodes 6, 7, respectively, are disposed asymmetrically with respect to the A axis.

In this surface acoustic wave element 1e, electrode patterns other than ground terminals 14e, 15e are symmetrically disposed with respect to the A axis.

This configuration represents a condition where inductance components are connected to the ground terminals 14e, 15e of the surface acoustic wave element 1e. Thus, as described before in reference to FIG. 4, the same effect as in the case where a matching circuit is connected to the connecting terminals 12, 13 is exerted in an equivalent circuit of the surface acoustic wave element 1e. The insertion loss and VSWR of the surface acoustic wave element can therefore be reduced. In addition, since this structure includes no parasite capacitance on the side of the connecting terminals 12, 13, deterioration of the amplitude balance degree or phase balance degree of the surface acoustic wave element 1e will not be caused. Accordingly, the balance degree of the surface acoustic wave device including this surface acoustic wave element 1e can be further improved.

Now, the structures of modifications of the mounting board 100 shown in FIG. 2 are described.

FIG. 10 is a plan view showing respective layers of a first modification of the mounting board shown in FIG. 2.

In this modified mounting board 100a, the area of the ground conductor 114a is formed larger than that of the mounting board 100 shown in FIG. 2. Also, the diameter (i.e, cross-sectional area) of the ground through conductor 124a connected to the ground conductor 114a is formed larger than the ground through conductor 124 in FIG. 2.

By increasing the area ratio between the ground conductors 114a and 115a, and between the ground through conductors 124a and 125a, it is possible to increase the ratio between inductances generated at the ground conductors 114a and 115a. This prevents parasite capacitance from being added to the connecting terminals 12 and 13 of the surface acoustic wave device, so that the balance degree can be well maintained. Accordingly, the surface acoustic wave device including this mounting board 100a can further decrease insertion loss and VSWR.

FIG. 11 is a plan view showing respective layers of a second modification of the mounting board shown in FIG. 2.

In this second modification, as the mounting board 100b shown in FIG. 11, the part corresponding to the ground conductor 124a in the mounting board 100a shown in FIG. 10 is formed as a plurality of ground through conductors 124b (the number is two in this embodiment).

In this mounting board 100b, since the numbers (or in effect the cross-sectional areas) of the ground through conductors 124b and the ground through conductor 125 are different from each other with respect to the A axis, almost the same effect as the mounting board 100a shown in FIG. 10 can be obtained.

Meanwhile, as shown in FIG. 11, one of the plurality of ground through conductors 124b may be disposed so that the one and the ground through conductor 125 are symmetrical with respect to the A' axis.

As described so far, in the mounting board 100, 100a and 100b shown in FIGS. 2, 10 and 11, respectively, by disposing conductors such that the ground conductor 115 and the ground conductors 114, 114a or 114b are asymmetrical with respect to the A' axis, and the ground through conductor 125 and the ground through conductors 124, 124a or 124b are asymmetrical with respect to the A' axis, or by providing difference in cross-sectional area between the conductors, the surface acoustic wave device including the mounting board 100 (100a or 100b) in effect can reduce the insertion loss and VSWR.

Figure 12:
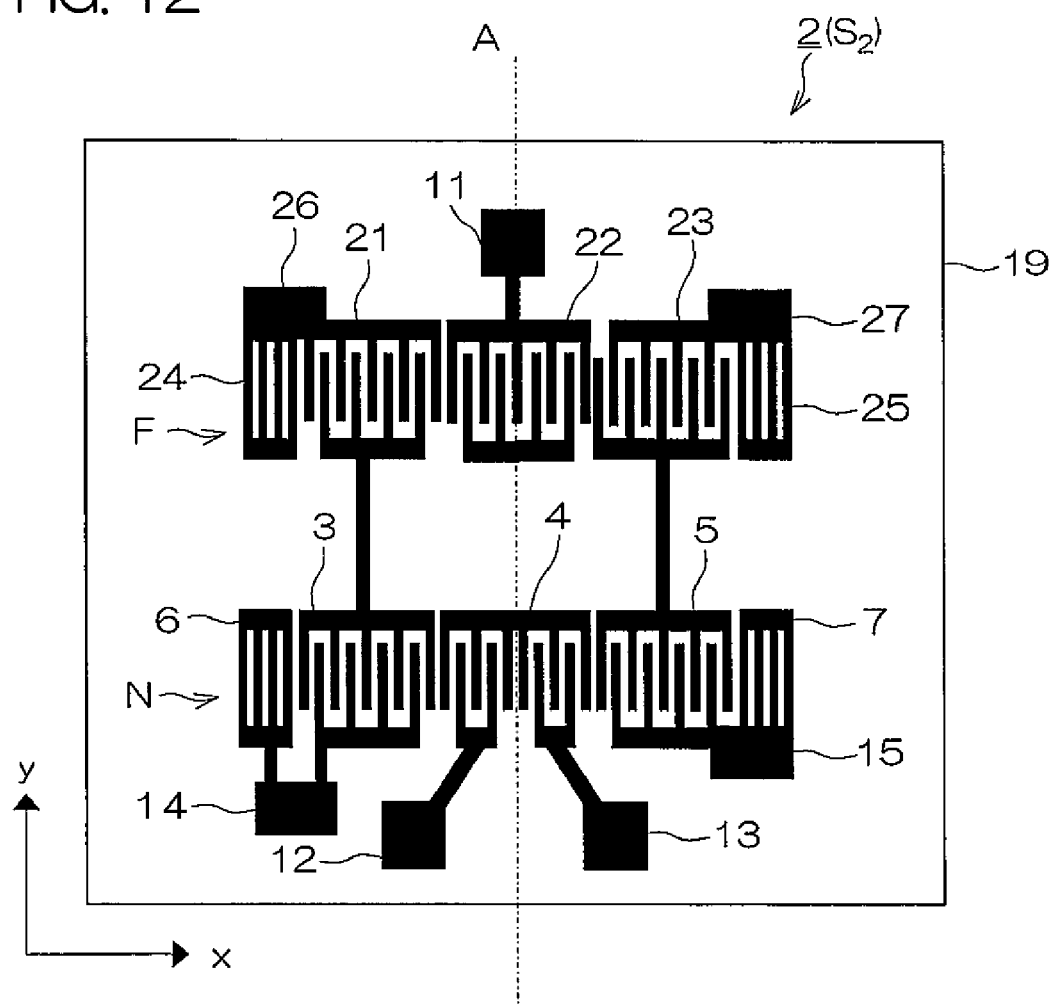
FIG. 12 is a plan view showing a second embodiment of a surface acoustic wave element included in a surface acoustic wave device according to another embodiment of the present invention.
Figure 13:
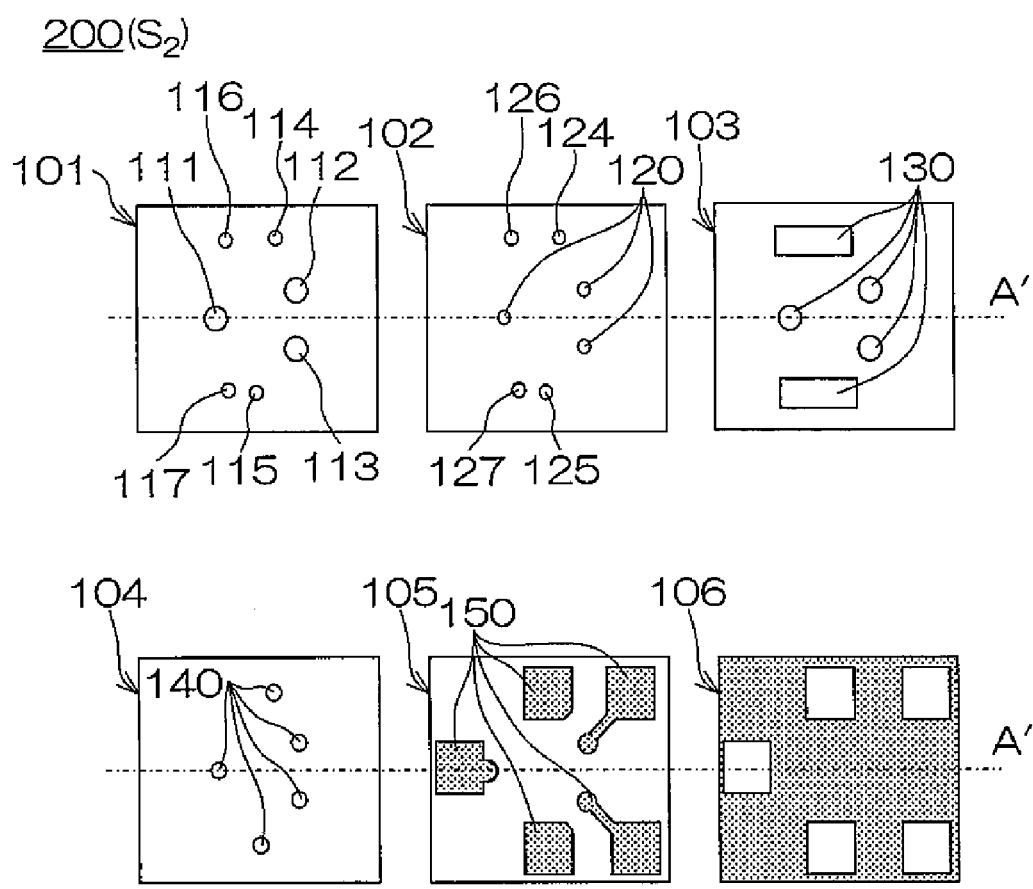
FIG. 13 is a plan view showing respective layers of a second embodiment of a mounting board included in a surface acoustic wave device according to another embodiment of the present invention.

FIG. 12 is a plan view showing a second embodiment of the surface acoustic wave element included in a surface acoustic wave device according to the present invention. FIG. 13 is a plan view showing respective layers of the mounting board used for this surface acoustic wave device.

The surface acoustic wave element 2 has the electrode pattern N of the surface acoustic wave element in the surface acoustic wave element 1 and another electrode pattern F of a surface acoustic wave element, which are cascade-connected to each other.

The electrode pattern F of this surface acoustic wave element includes three IDT electrodes 21, 22, 23 that are juxtaposed to each other on the principal surface of the piezoelectric substrate 19 along the direction of the X axis, and each have a plurality of electrode fingers formed along the Y axis direction. Also the electrode pattern F is provided with reflectors 24, 25 each having a plurality of electrode fingers formed along the Y axis direction, which are disposed on both sides of the row of IDT electrodes 21-23.

In addition, in the electrode pattern F of the surface acoustic wave element, the IDT electrode 21 and reflector 24 are connected to the ground terminal 26, and the IDT electrode 23 and reflector 25 are connected to the ground terminal 27.

On the other hand, as shown in FIG. 13, the mounting board 200 on which the surface acoustic wave element 2 is mounted has a structure including a upper surface layer 101 that is opposed to the surface acoustic wave element 2 to be joined thereto, a first through conductor layer 102 with through conductors 120 as via holes formed therein, an internal electrode pattern 103, a second through conductor layer 104 with through conductors 140 formed therein, a lower surface electrode pattern layer 105 and a lower surface dielectric layer 106, which are laminated together.

In the upper surface layer 101 of the mounting board 200, connecting pad conductors 111, 112, 113 are provided at positions opposed to the connecting terminals 11, 12, 13, respectively, and ground conductors 114, 115 are provided at positions opposed to the ground terminals 14, 15, respectively. The ground conductors 114-117 are joined to the through conductors 124-127 that are formed to penetrate the first through conductor layer 102 of the mounting board 200.

This structure allows the surface acoustic wave element 2 to be electrically connected to other circuit members through the mounting board 200.

The ground terminals 14 and 15 of the surface acoustic wave element 2 are, as shown in FIG. 12, asymmetrically disposed with respect to the A axis passing through the center of the IDT electrode 4 located at the center.

Also, the ground conductors 114 and 115 of the mounting board 200 corresponding to the ground terminals 14 and 15 are asymmetrically disposed with respect to the A' axis as shown in FIG. 13, and the ground through conductors 124 and 125 corresponding to the ground terminals 14 and 15 are asymmetrically disposed with respect to the A' axis.

The surface acoustic wave device S2 including the surface acoustic wave element 2 mounted on the mounting board 200 has the function of an unbalanced-balanced converter.

By disposing the ground terminals 14 and 15, the ground conductors 114 and 115 and the ground through conductors 124 and 125 asymmetrically, a condition where inductance components that are different from each other are connected to the ground terminals 14, 15 of the surface acoustic wave element 2 is realized.

Thus, as described referring to FIG. 4, the insertion loss and VSWR of the surface acoustic wave element 2 can be reduced. In addition, since no parasite capacitance is present on the side of the connecting terminals 12, 13, in this configuration, the amplitude balance degree or phase balance degree of the surface acoustic wave element 2 may not be deteriorated. As a result, the characteristics of the surface acoustic wave device S2 can be improved.

In addition to the foregoing advantages, since the surface acoustic wave element 2 has a structure in which the electrode pattern N and electrode pattern F of surface acoustic wave element are cascade-connected, signals out of the desired passband can be more greatly attenuated. Thus, the surface acoustic wave device including this surface acoustic wave element 2 is capable of properly separating and extracting signals within the desired passband.

Figure 14:
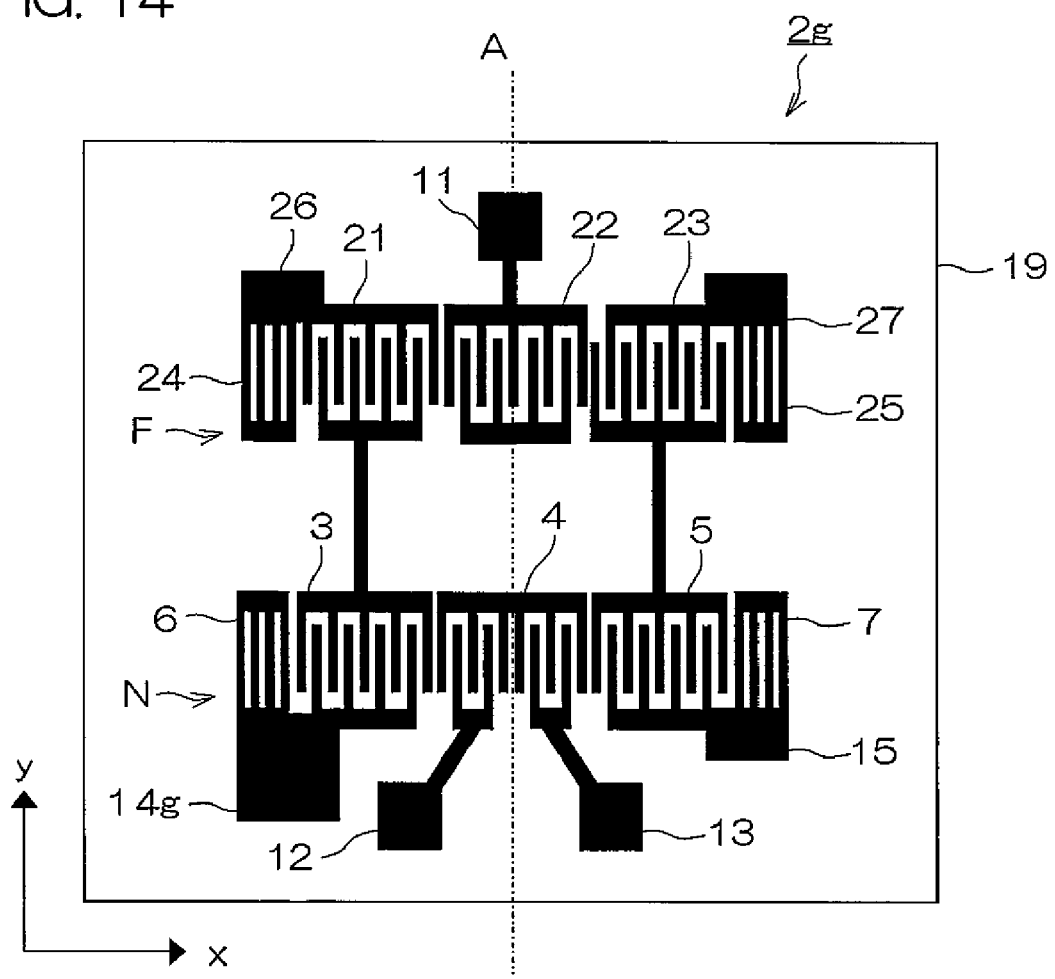
FIG. 14 is a plan view showing a first modification of the surface acoustic wave element according to the second embodiment.

FIG. 14 is a plan view showing a first modification of the surface acoustic wave element according to the second embodiment.

In the surface acoustic wave element 2g according to this modification, when compared with the case of the electrode pattern N of the surface acoustic wave element in FIG. 12, the ground terminal 14g connected to the IDT electrode 3 and reflector 6 has an extremely larger area than that of the ground terminal 15 connected to the IDT electrode 5 and reflector 7.

The surface acoustic wave device mounting the surface acoustic wave element 2g thereon is capable of providing inductance components that are more greatly different from each other in the wiring routes of the ground terminals 14g and 15 by increasing the area ratio between the ground terminals 14g and 15 that are asymmetric with respect to the A axis.

Thus, deterioration of the balance degree of the surface acoustic wave device including the surface acoustic wave element 2g can be reduced, and as a result, the insertion loss and VSWR can be further reduced.

Figure 15:
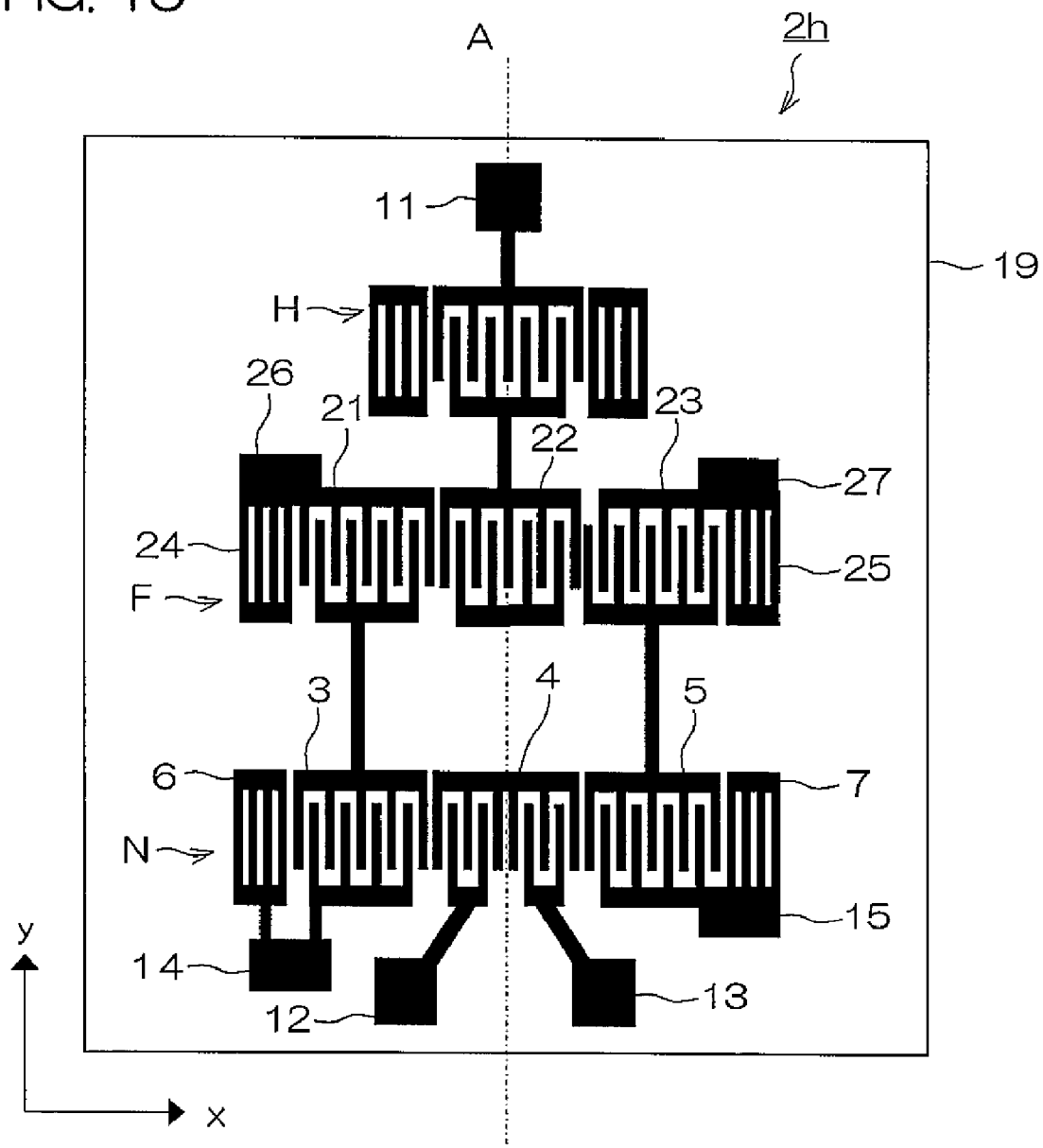
FIG. 15 is a plan view showing a second modification of the surface acoustic wave element according to the second embodiment.

FIG. 15 is a plan view showing a second modification of the surface acoustic wave element according to the second embodiment.

The surface acoustic wave element 2h has a configuration in which a surface acoustic wave resonator H is connected between the connecting terminal 11 in the surface acoustic wave element 2 shown in FIG. 12 and the electrode pattern F of surface acoustic wave element.

The surface acoustic wave resonator H includes one or more IDT electrodes each having a plurality of electrode fingers formed along the Y axis direction, and reflector electrodes that are disposed on both sides of the IDT electrodes and have a plurality of electrode fingers formed along the Y axis direction. Because of this structure, the surface acoustic wave resonator H resonates in one or more resonance modes.

Since this surface acoustic wave element 2h has a configuration including the surface acoustic wave resonator H connected thereto, impedance matching between the connecting terminals 11, 12, 13 for input signals (or output signals) and the input/output electrodes of the IDT electrodes can be easily accomplished.

Moreover, since an attenuation pole due to the surface acoustic wave resonator H is generated according to the frequency characteristic of the surface acoustic wave element 2h, the attenuation out of the passband can be further improved.

Accordingly, the surface acoustic wave device including this surface acoustic wave element 2h is capable of further reducing deterioration of the balance degree within the passband, and further reducing the insertion loss and VSWR.

While the surface acoustic wave resonator H is series-connected to the electrode pattern F in the embodiment shown in FIG. 15, it may be parallel-connected to the electrode pattern F.

Figure 16:
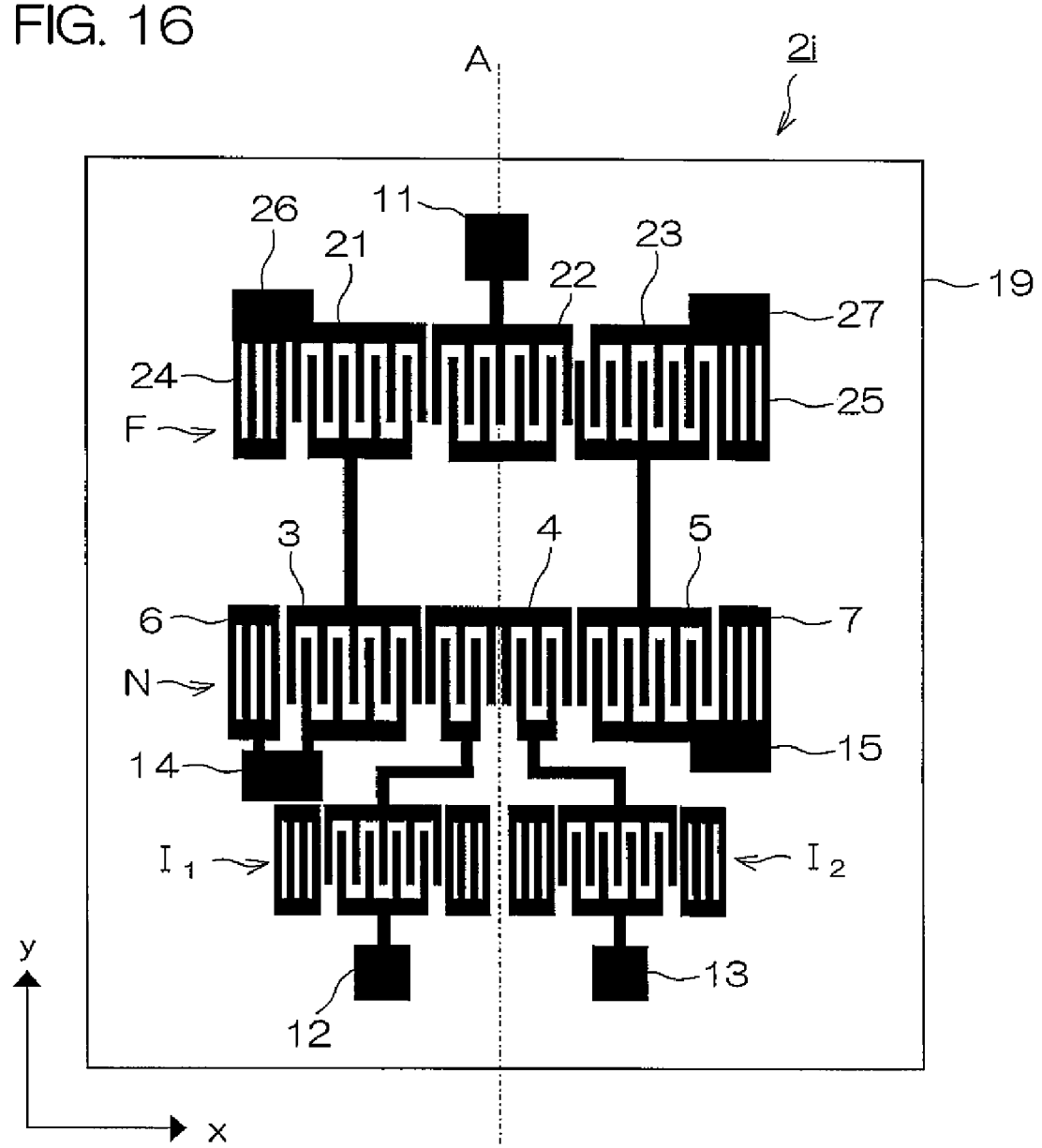
FIG. 16 is a plan view showing a third modification of the surface acoustic wave element according to the second embodiment.

FIG. 16 is a plan view showing a third modification of the surface acoustic wave element according to the second embodiment.

The surface acoustic wave element 2i according to this modification has a configuration in which surface acoustic wave resonators I1 and I2 are connected between the electrode pattern N and the connecting terminal 12 and between the electrode pattern N and the connecting terminal 13, respectively.

The surface acoustic wave resonators I1 and I2 each include one or more IDT electrodes each having a plurality of electrode fingers formed along the Y axis direction, and reflector electrodes that are disposed on both sides of the IDT electrodes and have a plurality of electrode fingers formed along the Y axis direction.

With this structure, the surface acoustic wave element 2i is capable of reducing deterioration of the balance degree within the passband, as well as further reducing the insertion loss and VSWR.

While in the embodiment shown in FIG. 16, the surface acoustic wave resonators I1 and I2 are series-connected to the electrode pattern N, the resonators I1 and I2 may be parallel-connected to the electrode pattern N.

Figure 17:
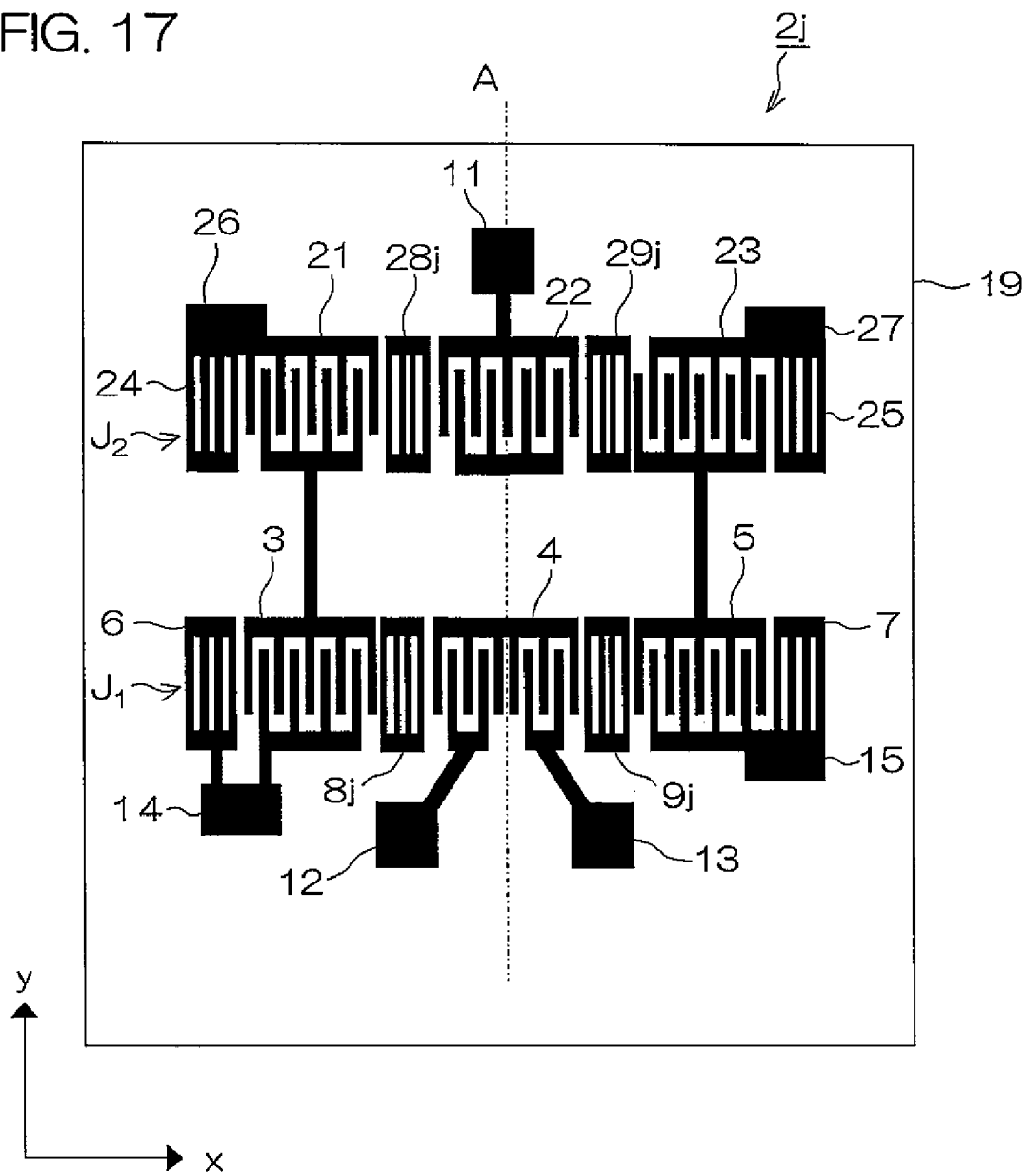
FIG. 17 is a plan view showing a fourth modification of the surface acoustic wave element according to the second embodiment.

FIG. 17 is a plan view showing a fourth modification of the surface acoustic wave element according to the second embodiment.

The surface acoustic wave element 2j includes an electrode pattern J1 having a configuration in which insertion reflectors 8j, 9j are inserted into the structure of the electrode pattern N of the surface acoustic wave element shown in FIG. 12, and an electrode pattern J2 having a configuration in which insertion reflectors 28j, 29j are inserted into the structure of the electrode pattern F of the surface acoustic wave element.

The electrode pattern J1 of this surface acoustic wave element has a configuration in which insertion reflectors 8j and 9j each having a plurality of electrode fingers formed along the Y axis direction are provided between the IDT electrodes of the electrode pattern N (between the IDT electrodes 3 and 4 and between the IDT electrodes 4 and 5) of the surface acoustic wave element shown in FIG. 12. The insertion reflectors 8j and 9j are each formed such that the distance between the centers of adjacent finger electrodes gradually narrows from the both ends toward the center thereof.

The electrode pattern J2 of the surface acoustic wave element has a configuration in which insertion reflectors 28j and 29j each having a plurality of electrode fingers formed along the Y axis direction are provided between the IDT electrodes of the electrode pattern F (between the IDT electrodes 21 and 22 and between the IDT electrodes 22 and 23) of the surface acoustic wave element shown in FIG. 12. The insertion reflectors 28j and 29j are each formed such that the distance between the centers of adjacent finger electrodes gradually narrows from the both ends toward the center thereof.

In this surface acoustic wave element 2j, since it is possible to control a period of multi standing wave modes generated from surface acoustic waves exited at the IDT electrode 4 by varying the pitch of the electrode fingers of the insertion reflectors 8j, 9j, frequencies to be filtered can be controlled according to the resonance phenomenon of this standing wave mode. For this reason, the surface acoustic wave device including this surface acoustic wave element 2*j* can achieve good electrical characteristics with wider passband and lower loss.

Figure 18:
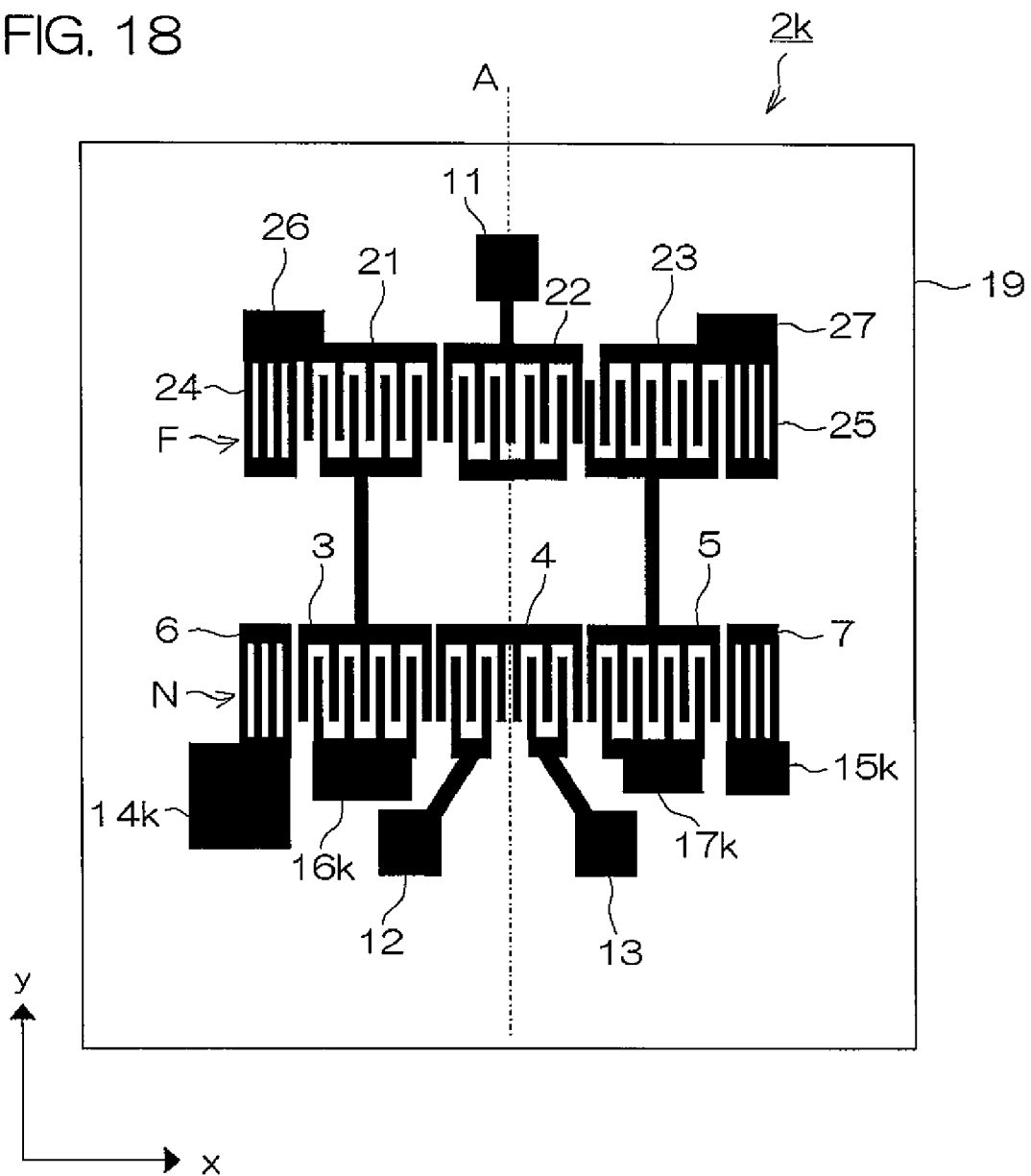
FIG. 18 is a plan view showing a fifth modification of the surface acoustic wave element according to the second embodiment.

FIG. 18 is a plan view showing a fifth modification of the surface acoustic element according to the second embodiment.

In comparison to the surface acoustic wave element 2 shown in FIG. 12, in the surface acoustic wave element 2*k* according to this modification, a ground terminal 14*k* is connected to the reflector 6, a ground terminal 16*k* is connected to the IDT electrode 3, a ground terminal 15*k* is connected to the reflector 7, and a ground terminal 17*k* is connected to the IDT electrode 5. The ground terminals 14*k* and 16*k* have larger areas than those of ground terminals 15*k* and 17*k*.

By disposing the electrode patterns other than the ground terminals 14*k*-17*k* symmetrically with respect to the A axis in this surface acoustic wave element 2*k*, it is possible to further improve the balance degree of the surface acoustic wave device including this surface acoustic wave element 2*k*.

Hereinafter, the structures of modifications of the mounting board 200 shown in FIG. 13 will be described.

Figure 19:
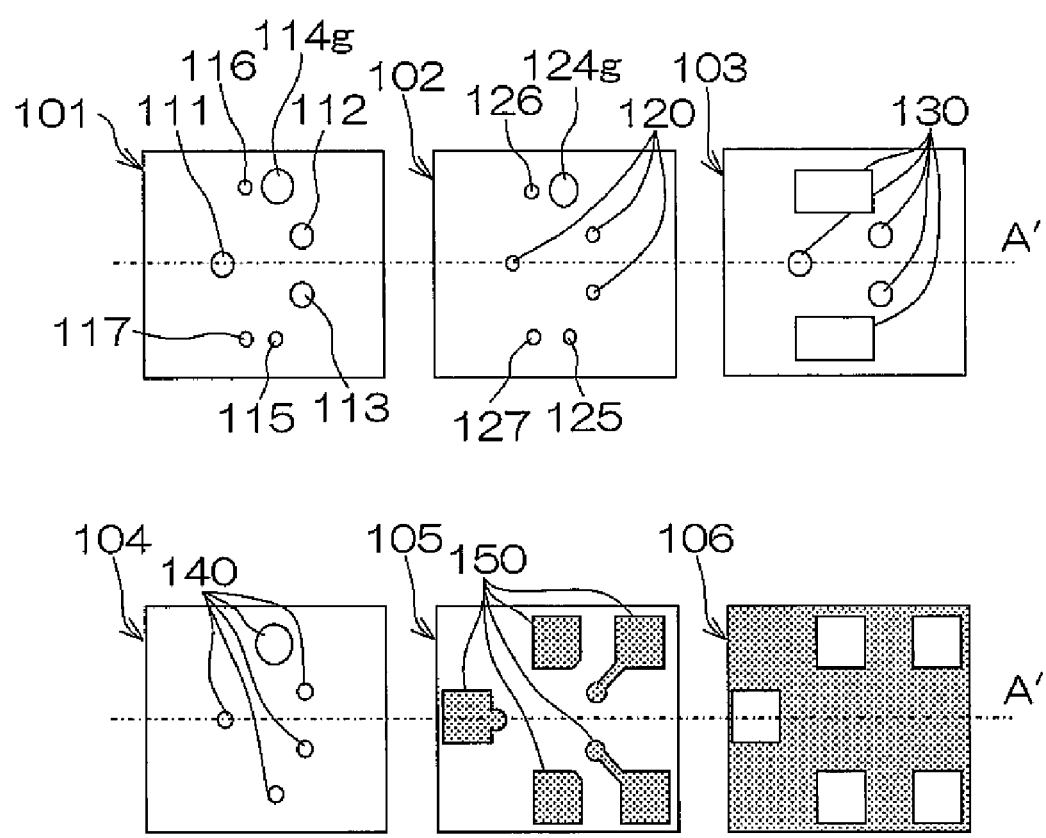
FIG. 19 is a plan view showing respective layers of a first modification of the mounting board according to the second embodiment shown in FIG. 13.

FIG. 19 is a plan view showing respective layers of a first modification of the mounting board of the second embodiment shown in FIG. 13.

In the mounting board 200*g* according to this modification, the diameter (cross-sectional area) of the ground conductor 114*g* is larger than that of the ground conductor 114 of the mounting board 200 shown in FIG. 13. Also, the diameter (cross-sectional area) of the ground through conductor 124*g* connected to the ground conductor 114*g* is larger than that of the ground though conductor 124.

In other words, the ratio of diameter (cross-sectional area) between the ground conductors 114*g* and 115, and the ratio of diameter (cross-sectional area) between the ground through conductors 124*g* and 125 are increased. This makes it possible to easily control inductance generated at the ground conductor 114*g* and ground through conductor 124*g*, and inductance generated at the ground conductor 115 and the ground through conductor 125. Thus, it is possible to prevent parasite capacitance from being added to the connecting terminals 12, 13 of the surface acoustic wave device so that the balance degree can be well maintained, and the surface acoustic wave device including this mounting board 200*g* is can reduce the insertion loss and VSWR.

Figure 20:
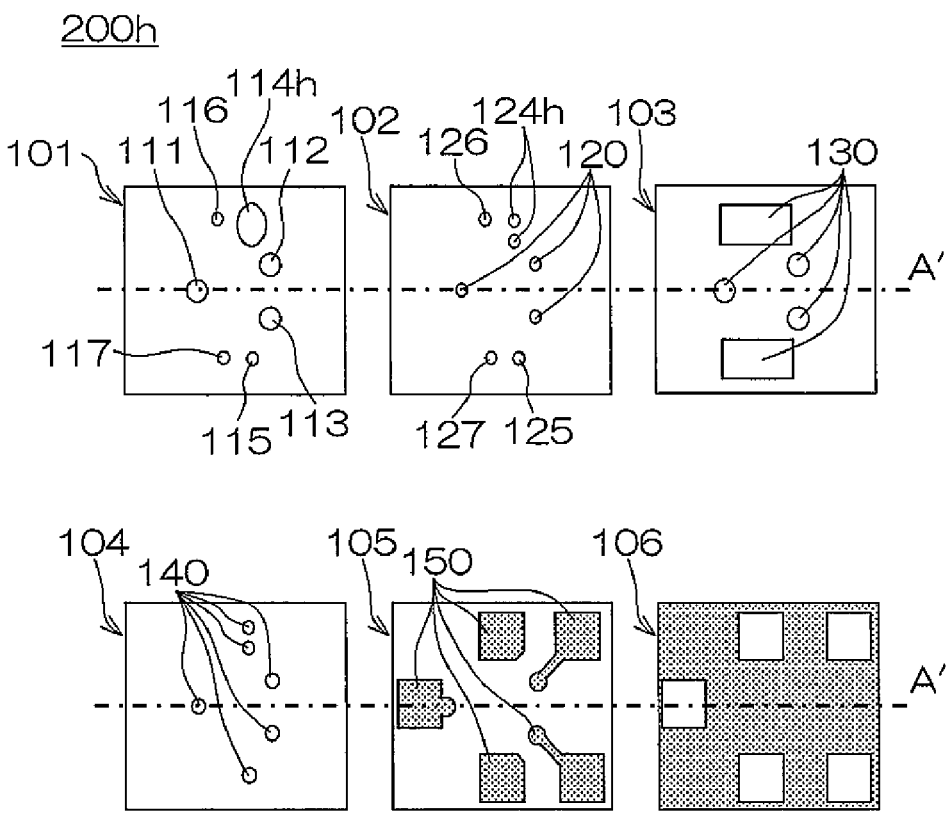
FIG. 20 is a plan view showing respective layers of a second modification of the mounting board according to the second embodiment shown in FIG. 13.

FIG. 20 is a plan view showing respective layers of a second modification of the mounting board according to the second embodiment shown in FIG. 13.

In the mounting board 200*h* shown in FIG. 20, the part corresponding to the ground conductor 124*g* in the mounting board 200*g* shown in FIG. 19 is formed as a plurality (two in this embodiment) of ground through conductors 124*h*.

Because of this structure, the mounting board 200*h* has ground through conductors 124*h* and ground through conductor 125 that are different in number with respect to the A' axis, so that almost the same effect as the mounting board 200*h* shown in FIG. 19 can be obtained.

As shown in FIG. 20, it is preferred that one of the plurality of ground through conductors 124*h* is located at such a position that the one and the ground through conductor 125 are symmetrical with respect to the A' axis.

As described so far, in the mounting boards 200, 200*g* and 200*h* shown in FIGS. 13, 19 and 20, respectively, by disposing conductors such that the ground conductors 114, 114*g*, 114*h* corresponding to the ground conductor 115, and the ground through conductors 124, 124*g*, 124*h* corresponding to the ground through conductor 125 are asymmetrical with respect to the A' axis, or by providing difference in cross-sectional area between the foregoing conductors, whereby the surface acoustic wave device including the mounting board 200 (200*g*, 200*h*) can reduce the insertion loss and VSWR.

In the foregoing surface acoustic wave elements 1, 1*a*-1*e*, 2, 2*g*-2*k*, the electrode patterns excluding the ground terminals (14, 15), ground conductors (114, 115) and ground through conductors (124, 125) provided for grounding are preferably arranged symmetrically with respect to the A axis or A' axis.

The surface acoustic wave devices including the foregoing surface acoustic wave elements can be preferably used for radio frequency circuits of mobile communication equipment and the like.

Figure 21:
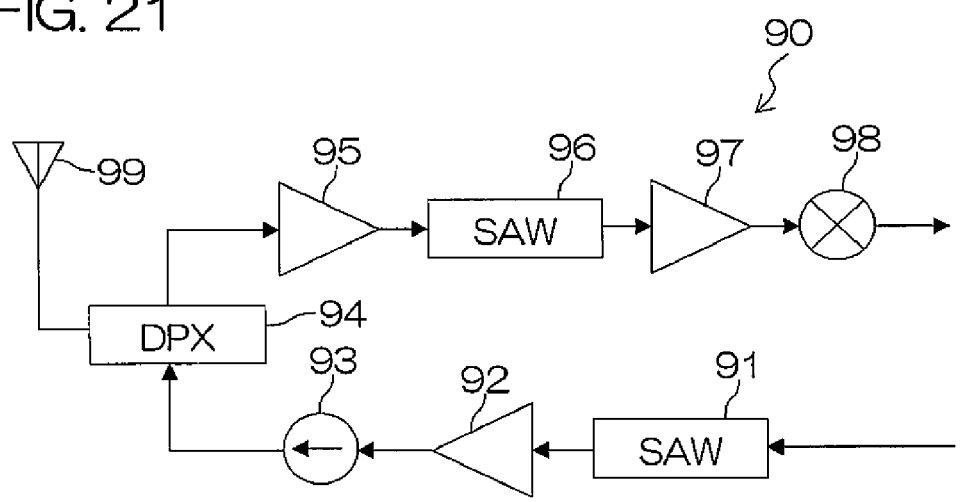
FIG. 21 is a block diagram of a radio frequency circuit of a portable phone.

FIG. 21 is a block diagram showing a radio frequency circuit 90 of a portable phone.

Radio frequency signals transmitted from a portable phone are, after unwanted signals are eliminated by a surface acoustic wave filter 91, amplified by a power amplifier 92, and then pass through an isolator 93 and a duplexer 94 mounting a surface acoustic wave device thereon according to the present invention to be radiated from an antenna 99.

Radio frequency signals received by the antenna 99 are separated by the foregoing duplexer 94 and amplified by a low-noise amplifier 95, and after unwanted signals thereof are eliminated by a surface acoustic wave filter 96, the signals are amplified again by an amplifier 97, and then converted into low frequency signals by a mixer 98.

As described above, by applying a surface acoustic wave device including the foregoing surface acoustic wave element to the duplexer 94, it is possible to provide a duplexer 94 that functions as a high quality surface acoustic wave filter with reduced insertion loss and VSWR without deteriorating the amplitude balance degree or phase balance degree. As a result, a radio frequency circuit 90 with good characteristics can be obtained.

Implementation of the present invention is not limited to the foregoing embodiments. For example, referring to FIG. 1, one of a couple of comb-shaped electrodes of the central IDT electrode 4 is separated into at least two parts, and connecting terminals 12, 13 are connected to the respective separated parts of the comb-shaped electrode, and one of a couple of comb-shaped electrodes of each of the IDT electrodes 3, 5 provided on both sides of the central IDT electrode is connected to the connecting terminal 11. However, these connecting terminals 11, 12, 13 may be of various sizes and shapes that are formed larger than the wires (conductive lines) including circular, elliptic, triangular and rectangular shapes, and polygonal shapes such as pentagons and other polygons with more sides. In addition, they may be of various sizes and shapes that are formed almost as large as the wires (conductive lines) including circular, elliptic, triangular and rectangular shapes, and polygonal shapes such as pentagons and other polygons with more sides. Furthermore, they may have cross-shapes with almost the same widths as the wires (conductive lines).

EXAMPLE

An example of a surface acoustic wave device according to the present invention will be hereinafter described.

The surface acoustic wave device S1 including the surface acoustic wave element 1 shown in FIG. 1 mounted on the mounting board 100 shown in FIG. 2 is described in detail.

In this Example, a surface acoustic wave device S1 designed for the PCS (Personal Communication Service)

having a center frequency in the 1800 MHz band used for mobile communication devices was produced.

First, a 38.7°-rotated Y-cut X-propagation LiTaO$_3$ single crystal was used to produce a base substrate. The "base substrate" refers to a substrate before being diced (cut) into individual piezoelectric substrates 19.

Then, the electrode patterns including IDT electrodes 3-5, reflector electrodes 6, 7, connecting wires, terminals 11-15 to be formed on the individual piezoelectric substrates 19 of the base substrate were formed by photolithography using a sputtering apparatus, Step and Repeat Exposure Systems (stepper), and an RIE (Reactive Ion Etching) apparatus as described below.

The base substrate was subjected to ultrasonic cleaning with acetone, IPA (isopropyl alcohol) and the like to remove organic components.

Then, after the base substrate was sufficiently dried in a clean oven, deposition of a metal film for forming the electrode patterns was carried out. The deposition of metal film was carried out in a sputtering apparatus using an Al (99 mass %)–Cu (1 mass %) alloy as the material. The thickness of the metal film at this point was about 0.16 μm.

Subsequently, a 0.5 μm thick photoresist layer was formed on the metal film by spin coating. Then, the film was patterned into desired shapes in the Step and Repeat Exposure Systems (stepper), and then unwanted portions of the photoresist layer were dissolved with an alkaline developing solution to expose the desired patterns. Thereafter, the metal film was etched using the RIE apparatus to complete the patterning process. Thus, various electrode patterns of the surface acoustic wave element 1 of the present invention were formed on the base substrate.

Subsequently, a 0.02 μm thick SiO$_2$ film was formed as a protective film over the regions in which the electrode patterns were formed using a CVD (Chemical Vapor Deposition) apparatus.

Thereafter, a photoresist layer was formed on the surface of the base substrate on which the various electrode patterns were formed, and then patterning for forming a window frame opening for flip-chip mounting was carried out by photolithography, and the window frame opening part was formed by etching using an RIE apparatus or the like. Thereafter, a metal film composed mainly of Al was deposited on the photoresist layer of the bottom surface of the base substrate using a sputtering apparatus. The thickness of the metal film at this stage was about 1.0 μm. Then the photoresist layer and unnecessary portions of Al film were removed simultaneously by a lift-off method. Thereafter, electrode pads for forming a joining layer for flip-chip mounting the surface acoustic wave element 1 on an external circuit board or the like were formed in the window frame opening.

Subsequently, a joining layer for flip-chip mounting was formed using a material including Au on the foregoing electrode pads using a bump bonding device. The diameter of this joining layer was about 80 μm, and the thickness thereof was about 30 μm.

Then, the base substrate was diced along the parting lines (dicing lines) to be divided into individual chips of surface acoustic wave elements 1.

Subsequently, the mounting board 100 was fabricated. The layers 101-106 of the mounting board 100 were formed using an insulating material such as ceramics or glass ceramics by laminating a plurality of the insulation layers together. Then, a slurry produced by homogeneously mixing and kneading a mixture of a metal oxide such as ceramics, an organic binder and an organic solvent was formed into sheet-like green sheets, and then patterns including through conductors 120, 140 were formed. Then, these green sheets were laminated and pressure-bonded together to form an integral body, which was then baked to produce the mounting board 100.

Subsequently, the individual chips were each mounted and secured on the mounting board 100 with the surface formed with the terminals 11-15 facing the top of the mounting board using a flip-chip mounting apparatus. For the mounting board 100, a 2.5×2.0 mm square laminate including multiple ceramic layers was used. Then, baking was carried out in N$_2$ atmosphere.

In this way, the surface acoustic wave device S1 including the surface acoustic wave element 1 shown in FIG. 1 and the mounting board 100 shown in FIG. 2 was produced.

Also, surface acoustic wave devices including the surface acoustic wave elements 1a-1e, 2, 2g-2k and the mounting boards 100a, 100b, 200, 200g, 200h can of course be produced by the same process as described above.

Subsequently, frequency characteristics of the surface acoustic wave devices of the present invention were measured.

Measurements of frequency characteristics of the surface acoustic wave devices were conducted for the cases of FIGS. 24-26 described below under the following conditions.

For the measurements below, the surface acoustic wave device S1 including the surface acoustic wave element 1 (see FIG. 1) mounted on the mounting board 100 (see FIG. 2) was used. In this surface acoustic wave device S1, the positions at which the ground terminal 14, ground conductor 114 and ground through conductor 124 were disposed were adjusted so that the magnitudes of inductance components generated at the ground terminals 14, 15 of the surface acoustic wave device S1 were L1 and L2, respectively. The values of them were determined to be L1=0.1 nH, L2=0.18 nH. The values satisfy $0.1 \leq L1 \leq 0.3$ nH, $0.1 \leq L2 \leq 0.3$ nH and $0.1 \leq |L1-L2| \leq 0.2$ nH.

In contrast, as a comparative example, a surface acoustic wave device P including a surface acoustic wave element 1p (see FIG. 22) mounted on the mounting board 100p (see FIG. 23) was used.

Figure 22:
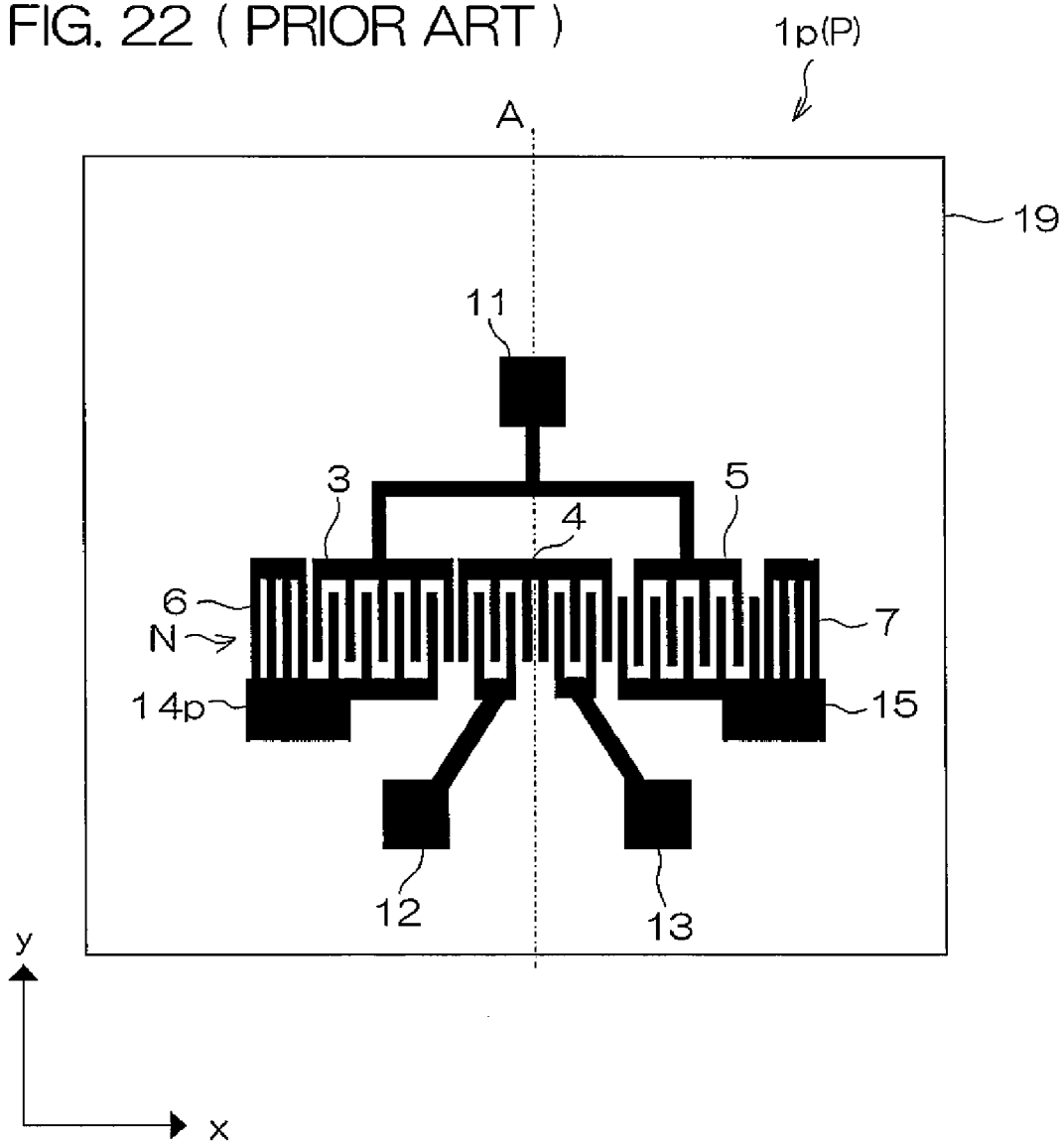
FIG. 22 is a plan view showing a surface acoustic wave element included in a surface acoustic wave device as comparative example.

In the surface acoustic wave element 1p shown in FIG. 22, in comparison to the surface acoustic wave element 1, ground terminals 14p and 15 are symmetrically disposed and shaped with respect to the A axis.

Figure 23:
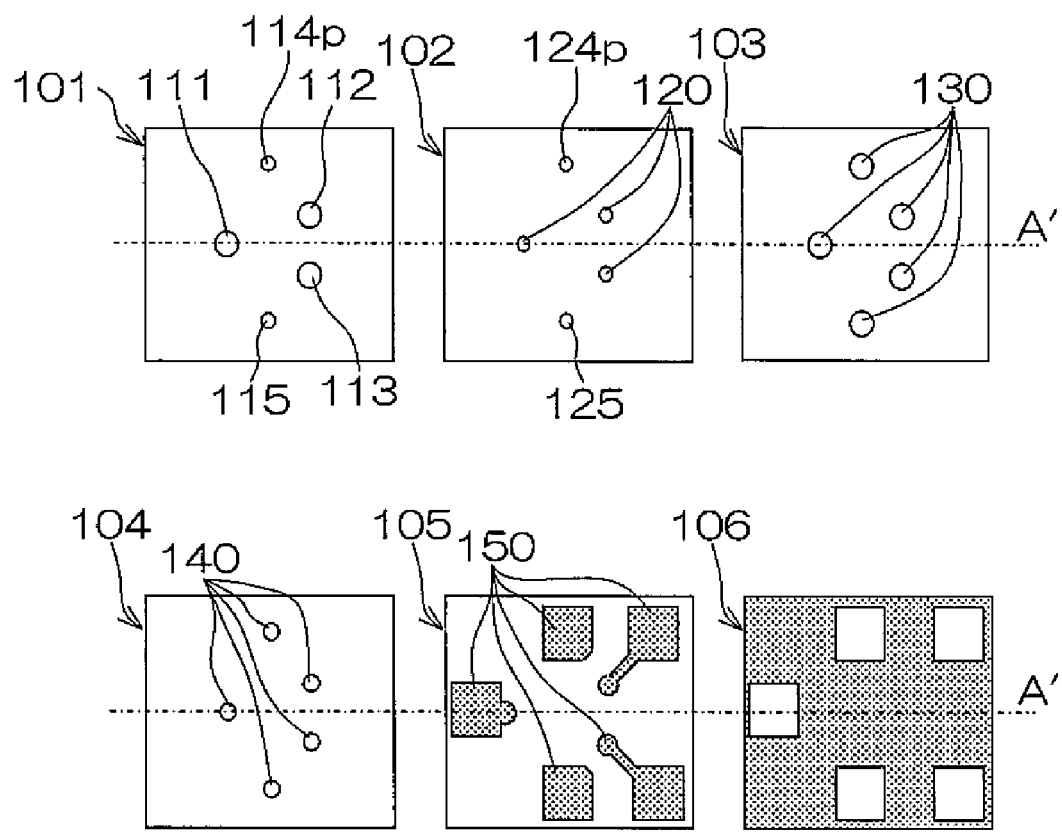
FIG. 23 is a plan view showing respective layers of a mounting board included in a surface acoustic wave device as comparative example.

In the mounting board 100p shown in FIG. 23, in comparison to the mounting board 100, the ground conductor 14p and ground conductor 15 are symmetrically disposed and shaped, and the ground through conductor 124p and ground through conductor 125 are symmetrically disposed and shaped with respect to the A' axis.

For the measurements below, Multiport Network Analyzer ("E5071A" produced by Agilent Technologies, Inc.) was used as the measuring device, and with a signal of 0 dBm being input in a frequency range of 1640-2140 MHz, measurements of the surface acoustic wave device S1 and surface acoustic wave device P were performed at 801 measurement points. The number of samples of each of the surface acoustic wave device S1, and the surface acoustic wave device P was 30.

Figure 24:
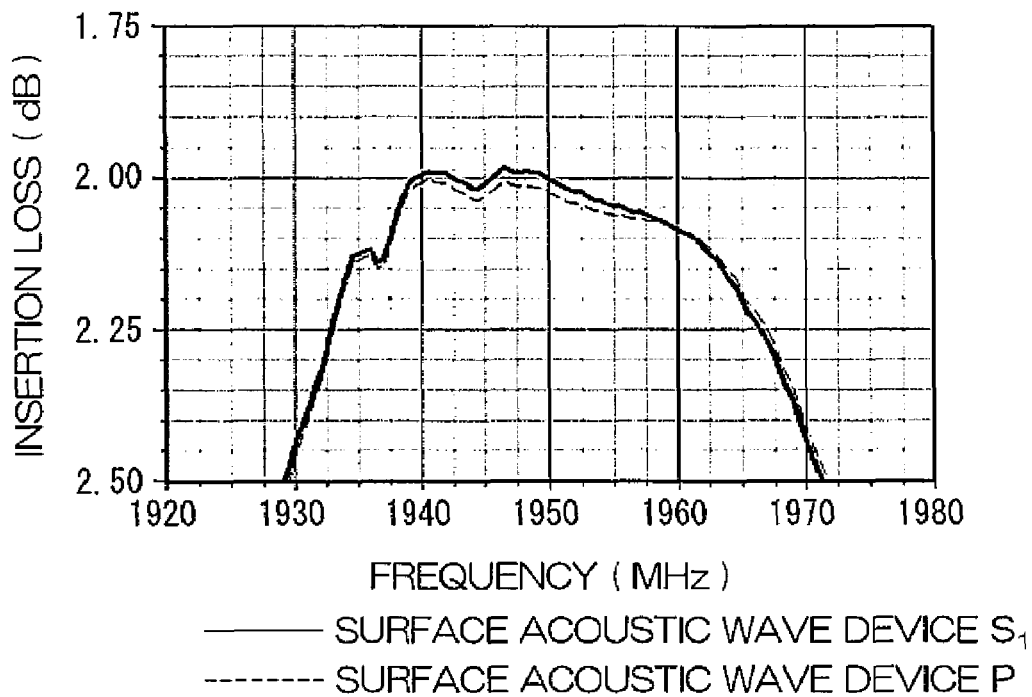
FIG. 24 is a graph showing the relationships between frequency and insertion loss of respective surface acoustic wave devices.
Figure 25:
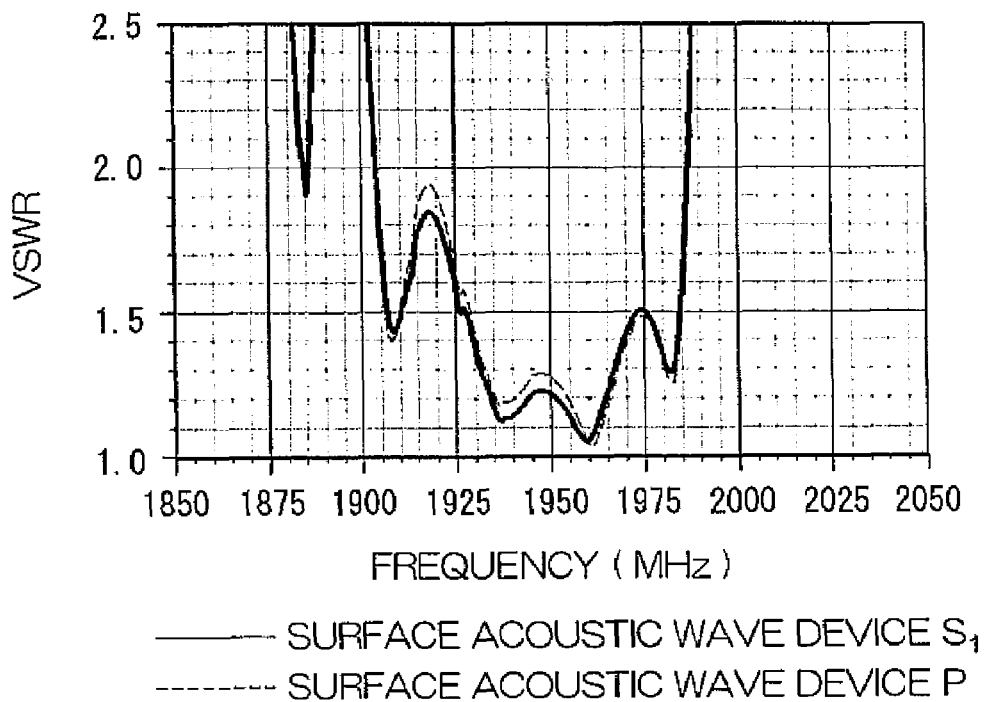
FIG. 25 is a graph showing the relationships between frequency and VSWR of respective surface acoustic wave devices.
Figure 26:
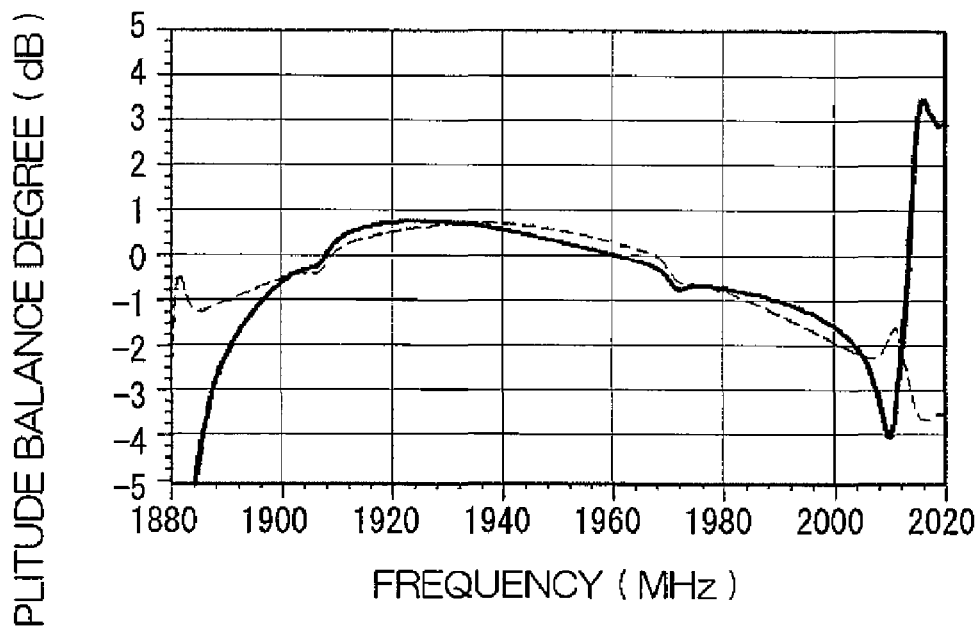
FIG. 26($a$) is a graph showing the relationships between frequency and amplitude balance degree of respective surface acoustic wave devices, and FIG. 26($b$) is a graph showing the relationships between frequency and phase balance degree of surface acoustic wave devices.
Figure 26:
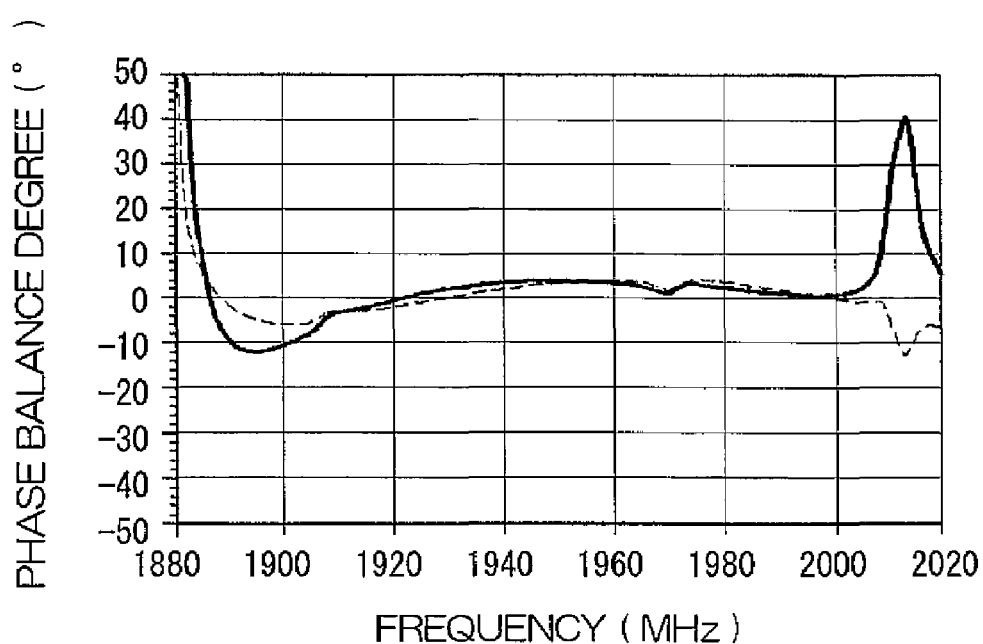

In the graphs shown in FIGS. 24-26, solid lines represent filter characteristics of the surface acoustic wave device S1 of the present invention, and broken lines represent filter characteristics of the surface acoustic wave device P of the comparative example.

FIG. 24 is a graph showing the relationships between frequency and insertion loss of the surface acoustic wave devices S1 and P.

FIG. 24 shows that the surface acoustic wave device S1 had an insertion loss of about 1.97 dB at a frequency of 1947 MHz. On the other hand, the surface acoustic wave device P as comparative example had an insertion loss of about 1.99 dB at a frequency of 1947 MHz (and 1941 MHz).

In addition, FIG. 24 shows that in the surface acoustic wave device S1 of the present invention, insertion loss was improved by about 0.02 dB on average in a frequency range of about 1930-1960 MHz as compared with the surface acoustic wave device P as comparative example.

Accordingly, it has been verified that the surface acoustic wave device S1 of the present invention including the surface acoustic wave element 1 was able to improve the insertion loss within the passband. The reason for this is speculated that a condition where inductance components were added to the connecting terminals 14, 15 of the surface acoustic wave element 1 occurred in the equivalent circuit of the surface acoustic wave element 1, and the same effect as in the case where a matching circuit was connected to the connecting terminals 12, 13 was exerted.

FIG. 25 is a graph showing the relationships between frequency and VSWR of the surface acoustic wave devices S1 and P.

FIG. 25 shows that in the surface acoustic wave device S1 of the present invention, the filter characteristic VSWR values within the passband were reduced on the whole as compared with the surface acoustic wave device P of the comparative example. In particular, the VSWR values were reduced by about an average of 0.1 between about 1915-1955 MHz.

Accordingly, it has been verified that the surface acoustic wave device S1 of the present invention with this structure was able to reduce VSWR within the passband. The reason for this is speculated that inductance components were added to the ground terminals of the surface acoustic wave device S1.

FIG. 26($a$) is a graph showing the relationships between frequency and amplitude balance degree of the surface acoustic wave devices S1 and P, and FIG. 26($b$) is a graph showing the relationships between frequency and phase balance degree of the surface acoustic wave devices S1 and P.

FIG. 26($a$) shows that it was possible by the surface acoustic wave device S1 of the present invention to bring the amplitude balance degree nearer to "0 dB" between frequencies of about 1900-2000 MHz as compared with the surface acoustic wave device P of the comparative example.

Moreover, FIG. 26($b$) shows that it was possible by the surface acoustic wave device S1 of the present invention to bring the phase balance degree nearer to "0 deg." between frequencies of about 1910-2000 MHz as compared with the surface acoustic wave device P of the comparative example.

Accordingly, it has been verified that the surface acoustic wave device S1 of the present invention was able to improve the amplitude balance degree and phase balance degree within the passband. The reason for this is speculated that a condition where inductance components whose values are controlled were added to the ground terminals 14, 15 of the surface acoustic wave element 1 occurred, by which the same effect as in the case where a matching circuit was connected to the connecting terminals 12, 13 was exerted.

Measurements of frequency-characteristics of the respective surface acoustic wave devices were conducted for the cases of FIGS. 29-31 described below under the following conditions.

For the measurements below, a surface acoustic wave device S2 including the surface acoustic wave element 2 (see FIG. 12) mounted on the mounting board 200 (see FIG. 13) was used. In this surface acoustic wave device S2, the positions at which the ground terminal 14, ground conductor 114 and ground through conductor 124 were disposed were adjusted so that the magnitudes of inductance components generated at the ground terminals 14, 15 of the surface acoustic wave device S2 were L1 and L2, respectively. Here, the values were determined to be L1=0.1 nH, L2=0.18 nH.

In contrast, as the comparative example, a surface acoustic wave device Q including a surface acoustic wave element $2q$ (see FIG. 27) mounted on a mounting board $200q$ (see FIG. 28) was used.

Figure 27:
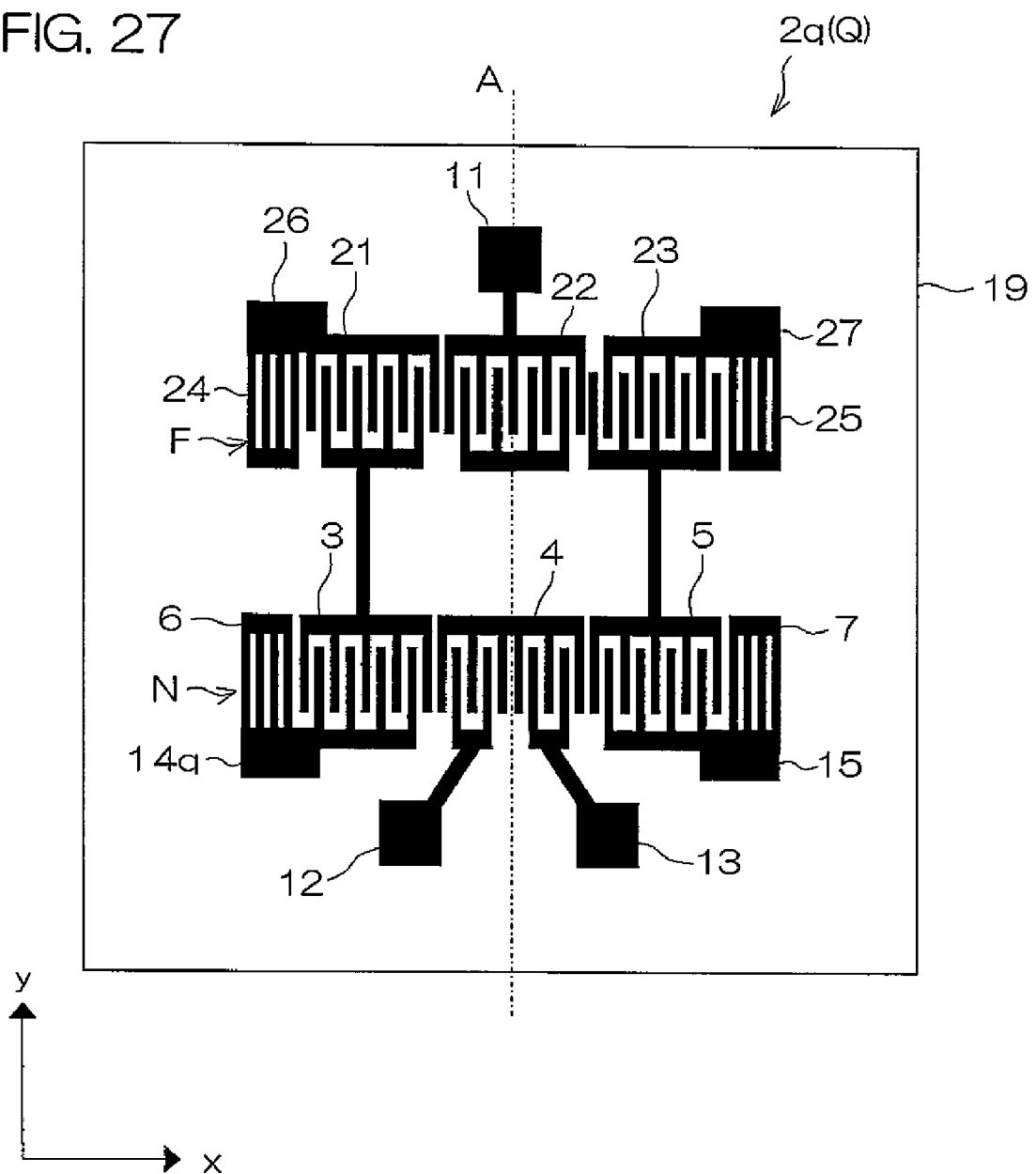
FIG. 27 is a plan view showing a surface acoustic wave element included in a surface acoustic wave device as comparative example.

In the surface acoustic wave element $2q$ shown in FIG. 27, in comparison to the surface acoustic wave element 2, ground terminals $14q$ and 15 are symmetrically disposed and shaped with respect to the A axis.

In the mounting board $200q$ shown in FIG. 28, in comparison to the mounting board 200, the ground conductor $114q$ and ground conductor 115 are symmetrically disposed and shaped, and the ground through conductor $124q$ and ground through conductor 125 are symmetrically shaped and disposed with respect to the A' axis.

For the measurements below, Multiport Network Analyzer ("E5071A" produced by Agilent Technologies, Inc.) was used as the measuring device, and with a signal of 0 dBm being input in a frequency range of 780-960 MHz, measurements of the surface acoustic wave device S2 and surface acoustic wave device Q were performed at 800 measurement points. The number of samples of each of the surface acoustic wave device S2, and the surface acoustic wave device Q was 30.

Figure 29:
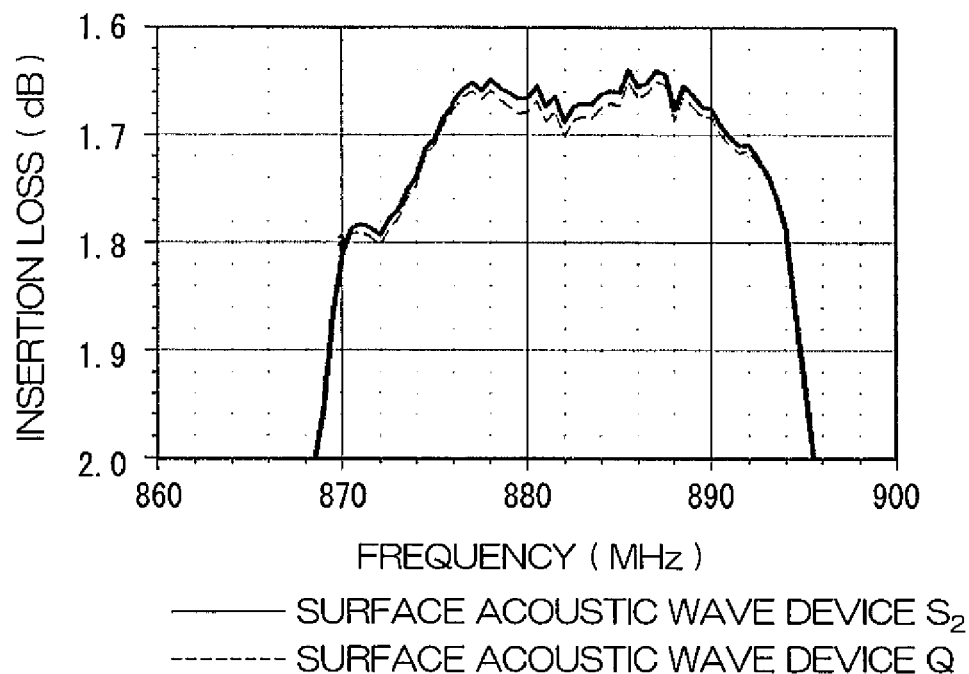
FIG. 29 is a graph showing the relationships between frequency and insertion loss of respective surface acoustic wave devices.
Figure 30:
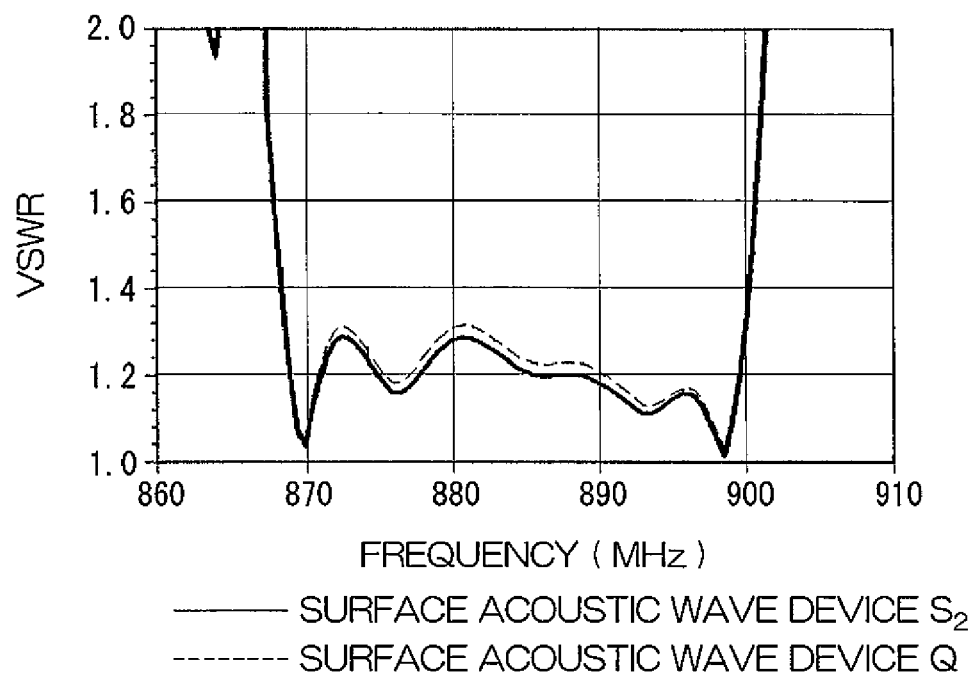
FIG. 30 is a graph showing the relationships between frequency and VSWR of respective surface acoustic wave devices.
Figure 31:
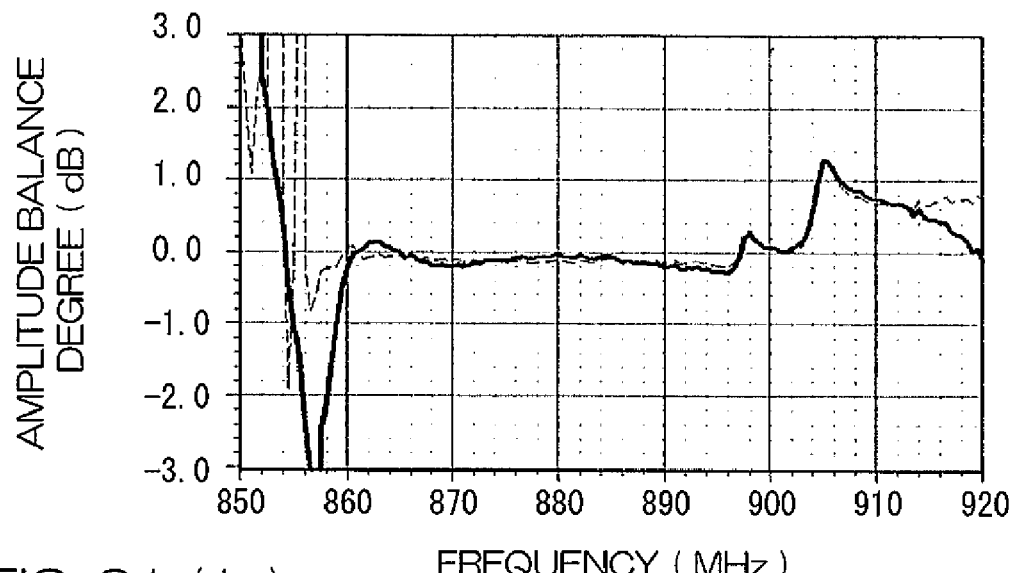
FIG. 31($a$) is a graph showing the relationships between frequency and amplitude balance degree of respective surface acoustic wave devices, and FIG. 31($b$) is a graph showing the relationships between frequency and phase balance degree of surface acoustic wave devices.
Figure 31:
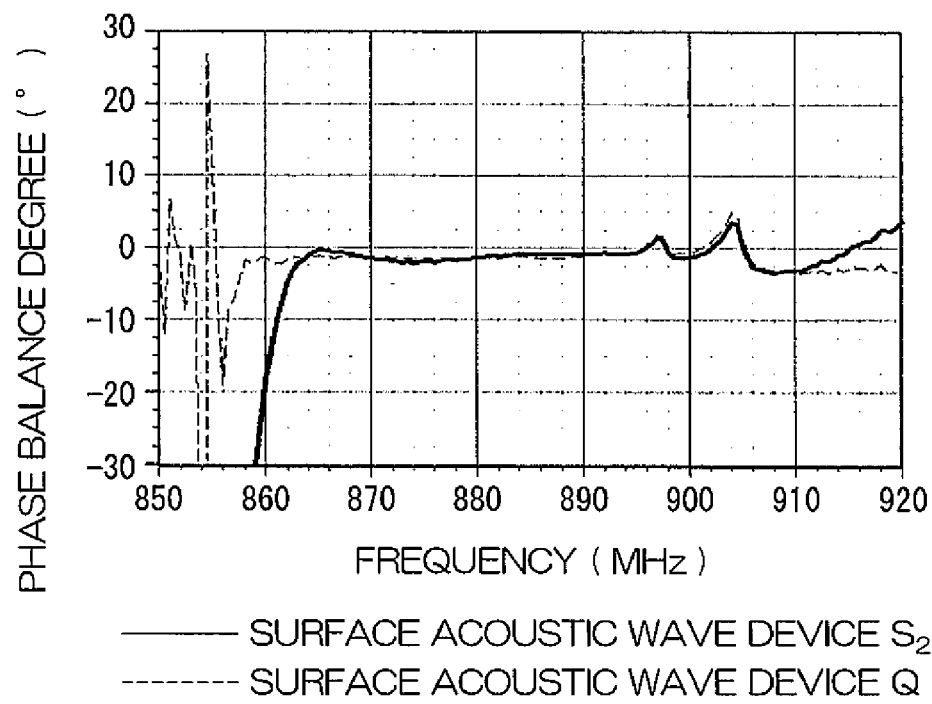
Figure 32:
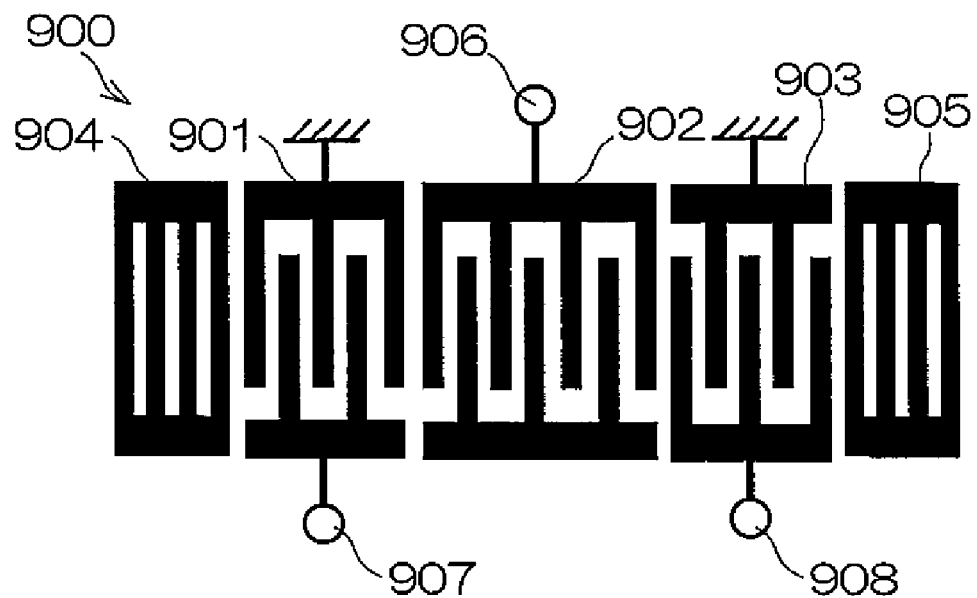
FIG. 32 is a plan view of a multielectrode type surface acoustic wave filter.
Figure 33:
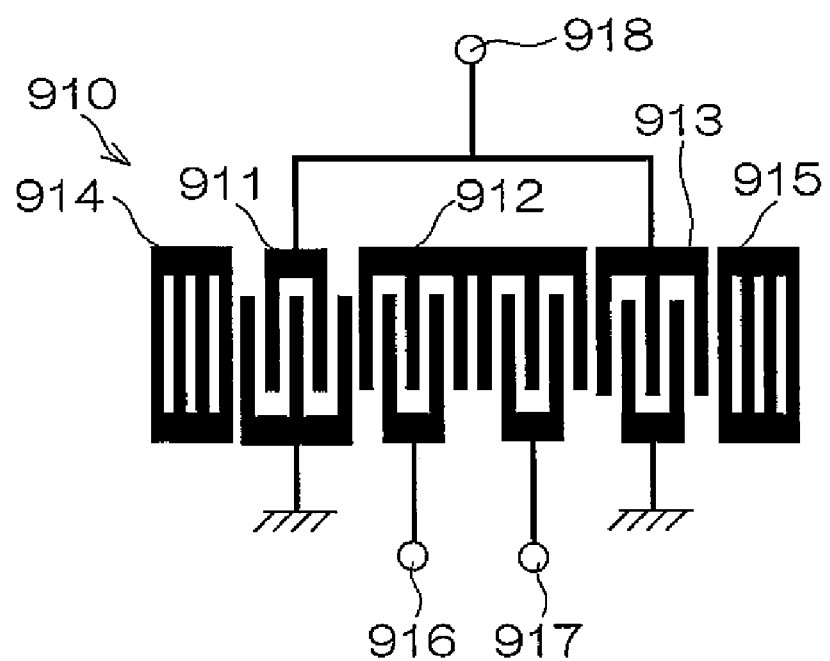
FIG. 33 is a plan view of a conventional surface acoustic wave filter.
Figure 34:
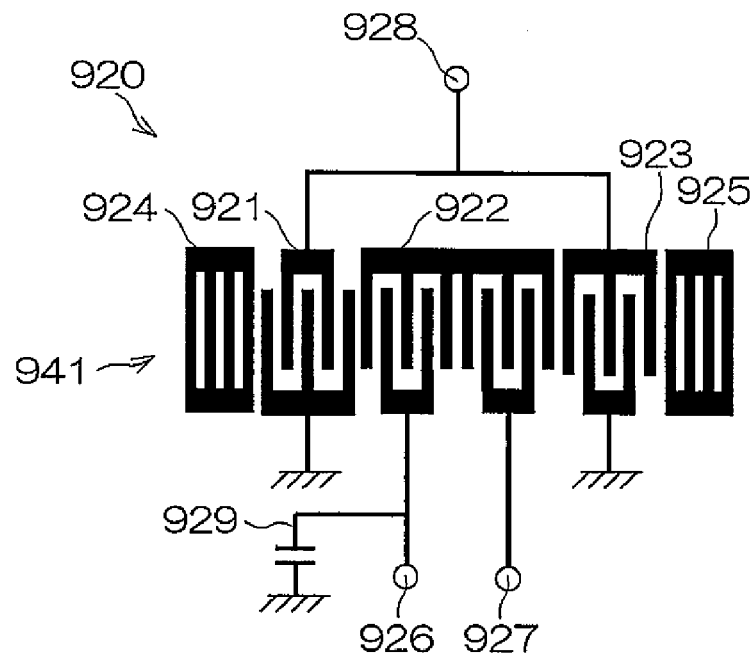
FIG. 34 is a plan view of a conventional surface acoustic wave filter.
Figure 35:
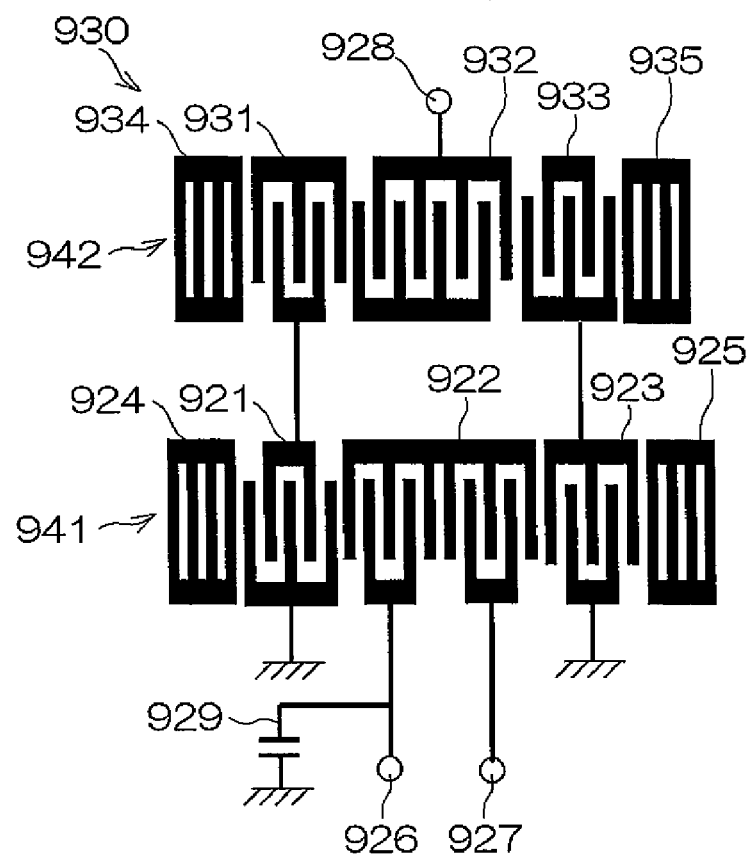
FIG. 35 is a plan view of a conventional surface acoustic wave filter.
Figure 36:
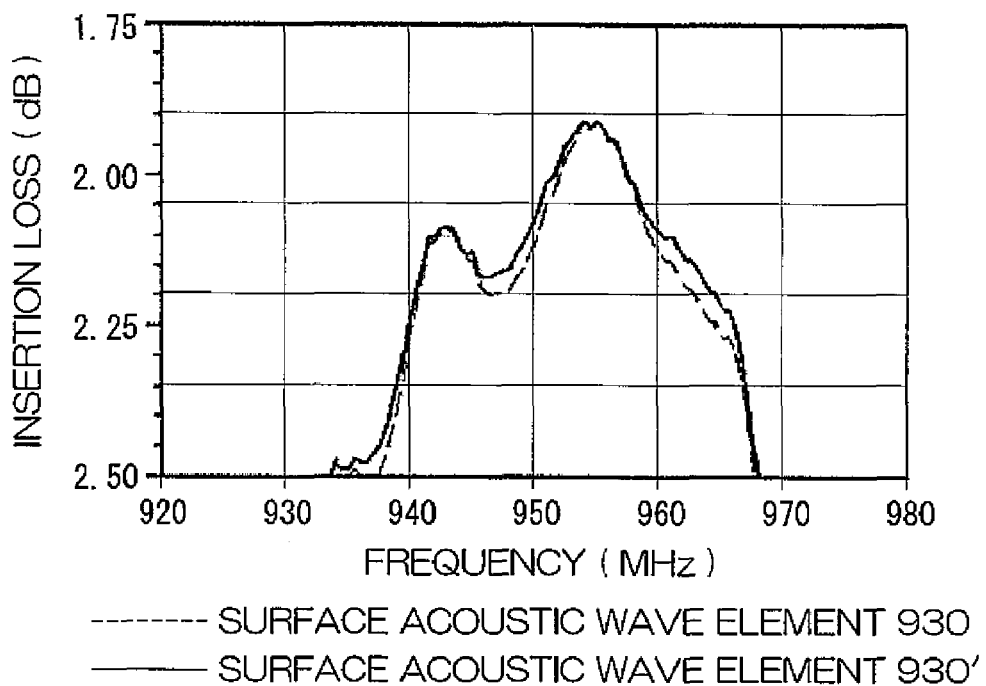
FIG. 36 is a graph showing the relationships between frequency and insertion loss of respective surface acoustic wave devices.
Figure 37:
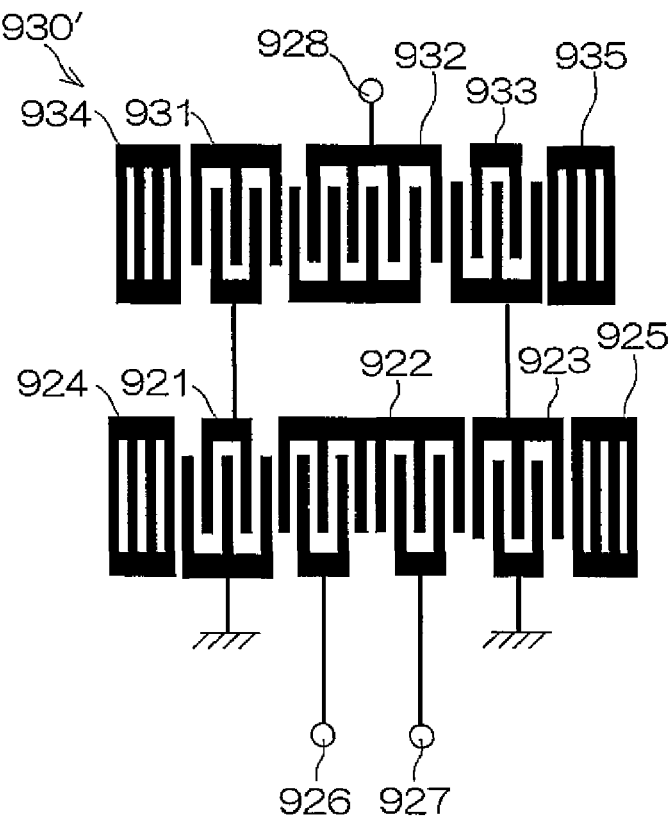
FIG. 37 is a plan view of a surface acoustic wave element that is not provided with the reactance (capacitance) component of the surface acoustic wave element shown in FIG. 35.
Figure 38:
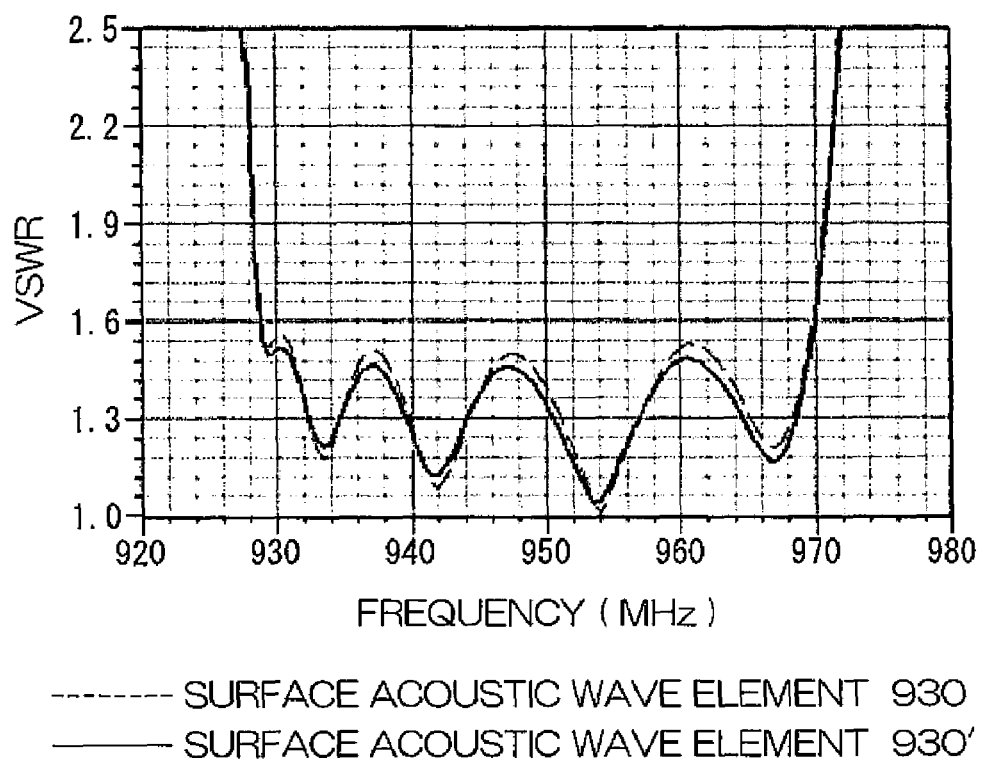
FIG. 38 is a graph showing the relationships between frequency and VSWR (Voltage Standing Wave Ratio) of respective surface acoustic wave elements.
Figure 39:
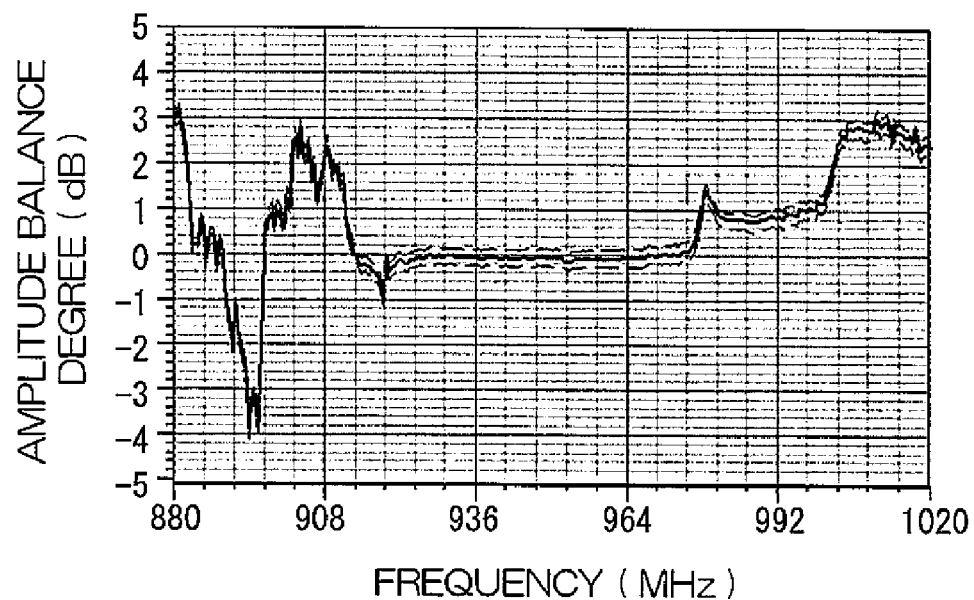
FIG. 39(a) is a graph showing amplitude balance degrees in the vicinity of the passband of respective surface acoustic wave elements.
FIG. 39(b) is a graph showing phase balance degrees of respective surface acoustic wave elements.
Figure 39:
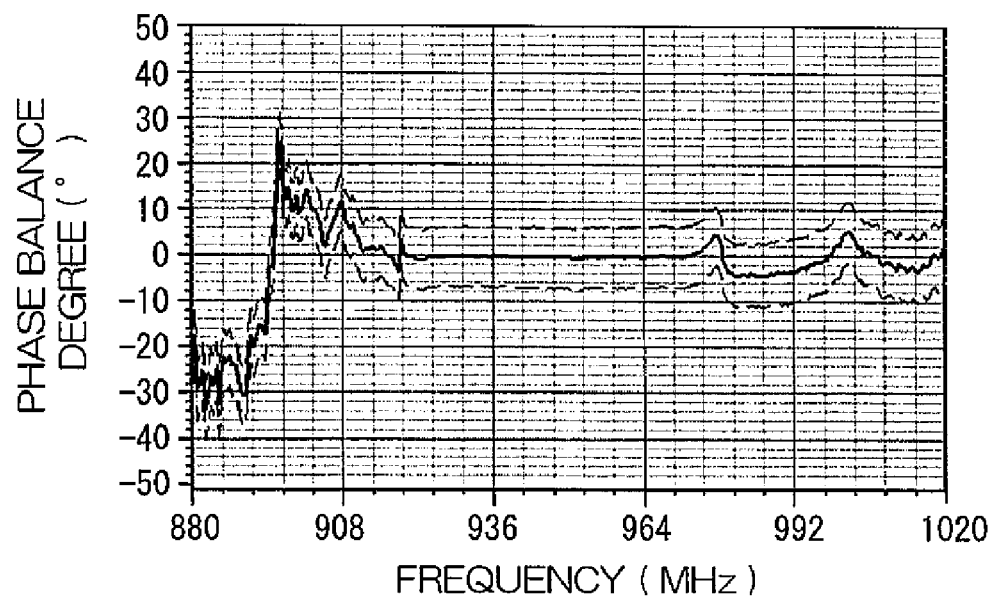

In the graphs shown in FIGS. 29-31, solid lines represent filter characteristics of the surface acoustic wave device S2 of the present invention, and broken lines represent filter characteristics of the surface acoustic wave device Q of the comparative example.

FIG. 29 is a graph showing the relationships between frequency and insertion loss of the surface acoustic wave devices S2 and Q.

FIG. 29 shows that the surface acoustic wave device S2 had an insertion loss of about 1.64 dB at a frequency of 887 MHz. On the other hand, the surface acoustic wave device Q as comparative example had an insertion loss of about 1.65 dB at a frequency of 887 MHz.

This shows that, in the surface acoustic wave device S2 of the present invention, insertion loss was improved by an average of about 0.01 dB in a frequency range of about 870-892 MHz as compared with the surface acoustic wave device Q as comparative example.

Accordingly, it has been verified that the surface acoustic wave device S2 of the present invention including the surface acoustic wave element 2 was able to improve the insertion loss within the passband. The reason for this is speculated that a condition where inductance components whose values were controlled were added to the connecting terminals 14, 15 of the surface acoustic wave element 2 occurred, by which the same effect as in the case where a matching circuit was connected to the connecting terminals 12, 13 was exerted.

FIG. 30 is a graph showing the relationships between frequency and VSWR of the surface acoustic wave devices S2 and Q.

FIG. 30 shows that in the surface acoustic wave device S2 of the present invention, the filter characteristic VSWR values within the passband were reduced as compared with the surface acoustic wave device Q of the comparative example. In particular, the VSWR values were reduced by about an average of 0.03 between about 870-898 MHz.

Accordingly, it has been verified that the surface acoustic wave device S2 of the present invention with this structure was able to reduce VSWR within the passband. The reason for this is speculated that a condition where inductance components were added to the ground terminals of the surface acoustic wave device S2 occurred, by which almost the same effect as in the case where a matching circuit was connected to the connecting terminals 12, 13 was exerted.

FIG. 31(a) is a graph showing the relationships between frequency and amplitude balance degree of the surface acoustic wave devices S2 and Q, and FIG. 31(b) is a graph showing the relationships between frequency and phase balance degree of the surface acoustic wave devices S2 and Q.

FIG. 31(a) shows that it was possible by the surface acoustic wave device S2 of the present invention to bring the amplitude balance degree nearer to "0 dB" between frequencies of about 865-910 MHz almost in the same manner as the surface acoustic wave device Q of the comparative example.

Moreover, FIG. 31(b) shows that it was possible by the surface acoustic wave device S2 of the present invention to bring the phase balance degree nearer to "0 deg." between frequencies of about 865-910 MHz almost in the same manner as the surface acoustic wave device Q of the comparative example.

Accordingly, it has been verified that the surface acoustic wave device S2 of the present invention with this structure was able to improve the amplitude balance degree and phase balance degree within the passband. The reason for this is speculated that a condition where inductance components were added to the ground terminals 14, 15 of the surface acoustic wave element 1 occurred, by which the same effect as in the case where a matching circuit was connected to the connecting terminals 12, 13 was exerted.

When the magnitudes of inductance components L1, L2 to be connected to the ground terminals of the surface acoustic wave device were set to 0.5 nH, the balance degrees were inferior to those of the conventional example. Therefore, in the present invention, the magnitudes of inductance components L1, L2 generated at the ground terminals 14 and 15 are preferably in a range of about 0.1-0.3 nH. In addition, preferably, $0.1 \leq |L1-L2| \leq 0.2$ nH is satisfied.

The invention claimed is:

1. A surface acoustic wave element comprising:
a piezoelectric substrate; and
a plurality of IDT electrodes of an odd number not less than three, wherein the plurality of IDT electrodes are formed along a propagation direction of surface acoustic waves propagating on the piezoelectric substrate,
wherein a first IDT electrode and a second IDT electrode are disposed on both sides of a third IDT electrode, wherein the third IDT electrode is located at the center of the plurality of IDT electrodes, wherein the first IDT electrode is connected to a first reference potential terminal and the second IDT electrode is connected to a second reference potential terminal,
and the first and second reference potential terminals are formed asymmetrically with respect to a virtual central axis that passes through the center of the third IDT electrode and provided in a direction perpendicular to the propagation direction, wherein the magnitudes of inductance components generated at the first and second reference potential terminals are not less than 0.1 nH and not more than 0.3 nH.

2. The surface acoustic wave element according to claim 1, wherein one of a couple of comb-shaped electrodes of the odd number of IDT electrodes constituting the IDT electrode formed at the center is separated into at least two parts.

3. The surface acoustic wave element according to claim 2, wherein connecting terminals are connected to the respective separated comb-shaped electrodes.

4. The surface acoustic wave element according to claim 1, wherein the first and second reference potential terminals are formed to be different from each other in at least one of position, shape and area.

5. The surface acoustic wave element according to claim 3, further comprising at least one surface acoustic wave resonator connected between a connecting terminal and the odd number of IDT electrodes.

6. The surface acoustic wave element according to claim 1, further comprising reflector electrodes that are disposed on both sides of the odd number of IDT electrodes and each have a plurality of finger electrodes formed in a direction perpendicular to the propagation direction.

7. A surface acoustic wave device comprising: a surface acoustic wave element for exciting surface acoustic waves by a plurality of IDT electrodes of an odd number not less than three, wherein the plurality of IDT electrodes are formed on a piezoelectric substrate,
a mounting board for mounting the surface acoustic wave element thereon,
wherein the surface acoustic wave element comprising the piezoelectric substrate and the plurality of IDT electrodes are formed along a propagation direction of surface acoustic waves propagating on the piezoelectric substrate, wherein a first IDT electrode and a second IDT electrode are disposed on both sides of a third IDT electrode that is located at the center of the plurality of IDT electrodes, wherein the first IDT electrode is connected to a first reference potential terminal and the second IDT electrode is connected to a second reference potential terminal, wherein the first and second reference potential terminals are formed asymmetrically with respect to a virtual central axis that passes through the center of the third IDT electrode and provided in a direction perpendicular to the propagation direction, and wherein the mounting board comprises a first ground conductor and a second around conductor, and
first ground through conductor connected from the first ground conductor and second ground through conductor connected from the second ground conductor, wherein the first ground through conductor and second ground through conductor penetrate the mounting board, wherein the first and second ground through conductors are formed asymmetrically with respect to the virtual central axis.

8. The surface acoustic wave device according to claim 7, wherein the first and second ground conductors are formed to be different from each other in at least one of position, shape and area so as to be asymmetrical with respect to the virtual central axis.

9. The surface acoustic wave device according to claim 7, wherein the first and second ground through conductors are formed to be different from each other in at least one of diameter, cross-sectional shape and number.

10. A communication device comprising: a signal receiving circuit that comprises the surface acoustic wave device according to claim 7.

11. A communication device comprising: a signal transmitting circuit that comprises the surface acoustic wave device according to claim 7.

12. A surface acoustic wave element comprising:
a piezoelectric substrate; and
a plurality of IDT electrodes of an odd number not less than three, wherein the plurality of IDT electrodes are formed along a propagation direction of surface acoustic waves propagating on the piezoelectric substrate, wherein a first IDT electrode and a second IDT electrode are disposed on both sides of a third IDT electrode, wherein the third IDT electrode is located at the center of the plurality of IDT electrodes, wherein the first IDT electrode is connected to a first reference potential terminal and the second IDT electrode is connected to a second reference potential terminal, and the first and second reference potential terminals are formed asymmetrically with respect to a virtual central axis that passes through the center of the third IDT electrode and provided in a direction perpendicular to the propagation direction, wherein the difference in magnitude between inductance components generated at the first and second reference potential terminals is not less than 0.1 nH and not more than 0.2 nH.

13. The surface acoustic wave element according to claim 12, wherein one of a couple of comb-shaped electrodes of the odd number of IDT electrodes constituting the IDT electrode formed at the center is separated into at least two parts.

14. The surface acoustic wave element according to claim 13, wherein connecting terminals are connected to the respective separated comb-shaped electrodes.

15. The surface acoustic wave element according to claim 14, further comprising at least one surface acoustic wave resonator connected between a connecting terminal and the odd number of IDT electrodes.

16. The surface acoustic wave element according to claim 12, wherein the first and second reference potential terminals are formed to be different from each other in at least one of position, shape and area.

17. The surface acoustic wave element according to claim 12, further comprising reflector electrodes that are disposed on both sides of the odd number of IDT electrodes and each have a plurality of finger electrodes formed in a direction perpendicular to the propagation direction.

* * * * *